(12) United States Patent
Bohizic et al.

(10) Patent No.: US 8,768,683 B2
(45) Date of Patent: *Jul. 1, 2014

(54) SELF INITIALIZED HOST CELL SPATIALLY AWARE EMULATION OF A COMPUTER INSTRUCTION SET

(71) Applicant: International Business Machines Corporation, Armonk, NY (US)

(72) Inventors: Theodore J Bohizic, Poughkeepsie, NY (US); Reid T Copeland, Markham (CA); Marcel Mitran, Markham (CA); Ali I Sheikh, Markham (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/866,366

(22) Filed: Apr. 19, 2013

(65) Prior Publication Data

US 2013/0231913 A1     Sep. 5, 2013

Related U.S. Application Data

(63) Continuation of application No. 12/562,464, filed on Sep. 18, 2009, now Pat. No. 8,447,583.

(51) Int. Cl.
    *G06F 9/455*    (2006.01)
    *G06F 17/50*    (2006.01)
    *G06F 13/10*    (2006.01)

(52) U.S. Cl.
    CPC ........ *G06F 9/45508* (2013.01); *G06F 9/45504* (2013.01); *G06F 17/5027* (2013.01); *G06F 13/105* (2013.01)
    USPC .............................................. 703/23; 703/26

(58) Field of Classification Search
    CPC ............ G06F 9/45508; G06F 17/5027; G06F 9/45504; G06F 13/105; G06F 12/1027; G06F 9/455; G06F 9/45554
    USPC ....................................................... 703/23, 26
    See application file for complete search history.

(56) References Cited

U.S. PATENT DOCUMENTS

| 5,551,013 A | 8/1996 | Beausoleil et al. |
| 5,560,013 A | 9/1996 | Scalzi et al. |

(Continued)

FOREIGN PATENT DOCUMENTS

| EP | 1037145 | 9/2000 |
| JP | 2008293479 | 12/2008 |
| WO | WO9815878 | 4/1998 |

OTHER PUBLICATIONS

Tolia et al. "Improving Mobile Database Access Over Wide-Area Networks Without Degrading Consistency", ACM Digital Library 978-1-595593-614, 1/7/0006, Jun. 11-14, 2007, pp. 71-84.

(Continued)

*Primary Examiner* — Aniss Chad
(74) *Attorney, Agent, or Firm* — Cantor Colburn LLP; Steven Chiu

(57) ABSTRACT

A plurality of Guest cells of Guest instructions are provided with corresponding Host cells for emulating Guest instructions, each Guest instruction having a Guest cell corresponding to a Host cell. Each of the Host cells are initialized with an initialization routine for discovering a corresponding semantic routine for emulating the Guest instruction. When an instruction is to be emulated for the first time, the initialization routine patches itself with the discovered semantic routine such that subsequent emulation of the Guest instruction can be directly performed.

15 Claims, 23 Drawing Sheets

(56) References Cited

U.S. PATENT DOCUMENTS

| | | | |
|---|---|---|---|
| 5,574,873 A | 11/1996 | Davidian | |
| 5,742,802 A | 4/1998 | Harter et al. | |
| 5,790,825 A | 8/1998 | Traut | |
| 5,870,575 A | 2/1999 | Kahle et al. | |
| 5,953,520 A | 9/1999 | Mallick | |
| 5,956,495 A | 9/1999 | Kahle et al. | |
| 5,995,743 A | 11/1999 | Kahle et al. | |
| 6,009,261 A | 12/1999 | Scalzi et al. | |
| 6,085,233 A | 7/2000 | Jeffrey et al. | |
| 6,099,274 A | 8/2000 | Conn | |
| 6,308,255 B1 | 10/2001 | Gorishek, IV et al. | |
| 6,317,872 B1 | 11/2001 | Gee et al. | |
| 6,332,216 B1 | 12/2001 | Manjunath | |
| 6,430,667 B1 | 8/2002 | Loen | |
| 6,463,582 B1 | 10/2002 | Lethin et al. | |
| 6,564,179 B1 | 5/2003 | Belhaj | |
| 6,718,457 B2 | 4/2004 | Tremblay et al. | |
| 6,813,764 B2 | 11/2004 | Stoodley | |
| 6,907,519 B2 | 6/2005 | Desoli | |
| 6,922,658 B2 | 7/2005 | Bohizic et al. | |
| 7,177,791 B1 | 2/2007 | Crandall et al. | |
| 7,552,436 B2 | 6/2009 | Brice et al. | |
| 7,571,090 B2 | 8/2009 | Kinney | |
| 7,882,499 B2 | 2/2011 | Post | |
| 8,099,274 B2 | 1/2012 | Bohizic et al. | |
| 8,301,434 B2 | 10/2012 | Bohizic et al. | |
| 8,428,930 B2 | 4/2013 | Bohizic et al. | |
| 2009/0249049 A1 | 10/2009 | Weissman et al. | |
| 2011/0071813 A1 | 3/2011 | Bohizic et al. | |
| 2011/0071814 A1 | 3/2011 | Bohizic et al. | |
| 2011/0071815 A1 | 3/2011 | Bohizic et al. | |
| 2011/0071816 A1 | 3/2011 | Bohizic et al. | |
| 2011/0112820 A1 | 5/2011 | Bohizic et al. | |

OTHER PUBLICATIONS

Treleaven et al. "Combining Data Flow and Control Flow Computing", The Computer Journal, vol. 25, No. 2, 1982, pp. 207-217.
Sullivan et al "Dynamic Native Optimization of Interpreters", ACM 1-58113-655-2/03/0006, Jun. 12, 2003.
IBM z/Architecture Principles of Operation, SA22-7832-07, 8th Edition, Feb. 2009.
U.S. Appl. No. 12/562,464 to Bohizic et al., filed Sep. 18, 2009, Office Action dated Sep. 13, 2012.
U.S. Appl. No. 12/562,464 to Bohizic et al., filed Sep. 18, 2009, Notice of Allowance dated , dated Jan. 14, 2013.
U.S. Appl. No. 12/562,564 to Bohizic et all, filed Sep. 18, 2009, Office Action dated Mar. 20, 2012.
U.S. Appl. No. 12/562,564 to Bohizic et all, filed Sep. 18, 2009, Office Action dated Oct. 2, 2012.
U.S. Appl. No. 12/562,564 to Bohizic et all, filed Sep. 18, 2009, Office Action dated Feb. 7, 2013.

702

```
4_byte_nop
move  regA, contextReg
bl subtract_handler(regA)
b  #ec_4
```
ec_2 — for S R3, 4 (R1)

```
move regB, #ec_3
move regA, contextReg
bl interrupt_handler(regA,regB)
b  #ec_4
```
ec_3

```
move regB, #ec_4
move regA, contextReg
b common_handler (regA, regB)
b  #ec_5
```
ec_4 — for MVC 4 (7 ,R2), 8 (R6)

SELF INITIALIZED HOST CELL SPATIALLY AWARE EMULATION OF A COMPUTER INSTRUCTION SET

CROSS-REFERENCE TO RELATED APPLICATION

This is a Continuation Application of U.S. patent application Ser. No. 12/562,464 "SELF INITIALIZED HOST CELL SPATIALLY AWARE EMULATION OF A COMPUTER INSTRUCTION SET", Filed Sep. 18, 2009, which application is incorporated herein by reference.

FIELD OF THE INVENTION

The present invention is related to computer systems and more particularly to emulation of a guest computer system processor by a host computer system processor having an incompatible instruction set architecture.

BACKGROUND OF THE INVENTION

Trademarks: IBM® may be a registered trademark of International Business Machines Corporation, Armonk, N.Y., U.S.A. S/390®, z900 and z990 and other product names are registered trademarks or product names of International Business Machines Corporation or other companies.

Before our invention IBM has created through the work of many highly talented engineers beginning with machines known as the IBM® System 360 in the 1960s to the present, a special architecture which, because of its essential nature to a computing system, became known as "the mainframe" whose principles of operation state the architecture of the machine by describing the instructions which may be executed upon the "mainframe" implementation of the instructions which had been invented by IBM inventors and adopted, because of their significant contribution to improving the state of the computing machine represented by "the mainframe", as significant contributions by inclusion in IBM's Principles of Operation as stated over the years. The Eighth Edition of the IBM® z/Architecture® Principles of Operation which was published February, 2009 has become the standard published reference as SA22-7832-07 and are incorporated in IBM's z9® mainframe servers. The IBM Z/Architecture® Principles of Operation, Publication SA22-7832-07 is incorporated by reference in its entirety herein.

Referring to FIG. 1A, representative components of a prior art Host Computer system 50 are portrayed. Other arrangements of components may also be employed in a computer system, which are well known in the art. The representative Host Computer 50 comprises one or more CPUs 1 in communication with main store (Computer Memory 2) as well as I/O interfaces to storage devices 11 and networks 10 for communicating with other computers or SANs and the like. The CPU 1 is compliant with an architecture having an architected instruction set and architected functionality. The CPU 1 may have Dynamic Address Translation (DAT) 3 for transforming program addresses (virtual addresses) into real address of memory. A DAT typically includes a Translation Lookaside Buffer (TLB) 7 for caching translations so that later accesses to the block of computer memory 2 do not require the delay of address translation. Typically a cache 9 may be employed between Computer Memory 2 and the Processor 1. The cache 9 may be hierarchical having a large cache available to more than one CPU and smaller, faster (lower level) caches between the large cache and each CPU. In some implementations the lower level caches are split to provide separate low level caches for instruction fetching and data accesses. In an embodiment, an instruction may be fetched from memory 2 by an instruction fetch unit 4 via a cache 9. The instruction may be decoded in an instruction decode unit (6) and dispatched (with other instructions in some embodiments) to instruction execution units 8. Typically several execution units 8 are employed, for example an arithmetic execution unit, a floating point execution unit and a branch instruction execution unit. The instruction may be executed by the execution unit, accessing operands from instruction specified registers or memory as needed. If an operand is to be accessed (loaded or stored) from memory 2, a load store unit 5 typically handles the access under control of the instruction being executed. Instructions may be executed in hardware circuits or in internal microcode (firmware) or by a combination of both.

U.S. Pat. No. 5,560,013 "METHOD OF USING A TARGET PROCESSOR TO EXECUTE PROGRAMS OF A SOURCE ARCHITECTURE" to Scalzi et al., filed Dec. 6, 1994, assigned to IBM, incorporated by reference herein teaches a method of utilizing large virtual addressing in a target computer to implement an instruction set translator (IST) for dynamically translating the machine language instructions of an alien source computer into a set of functionally equivalent target computer machine language instructions, providing in the target machine, an execution environment for source machine operating systems, application subsystems, and applications. The target system provides a unique pointer table in target virtual address space that connects each source program instruction in the multiple source virtual address spaces to a target instruction translation which emulates the function of that source instruction in the target system. The target system efficiently stores the translated executable source programs by actually storing only one copy of any source program, regardless of the number of source address spaces in which the source program exists. The target system efficiently manages dynamic changes in the source machine storage, accommodating the nature of a preemptive, multitasking source operating system. The target system preserves the security and data integrity for the source programs on a par with their security and data integrity obtainable when executing in source processors (i.e. having the source architecture as their native architecture). The target computer execution maintains source-architected logical separations between programs and data executing in different source address spaces—without a need for the target system to be aware of the source virtual address spaces.

"Dynamic Native Optimization of Interpreters" published 2000 by Hewlett-Packard Labs 1 Main St. Cambridge, Mass. 02142 incorporated herein by reference teaches "There is a long history of approaches to removing interpretive overhead from programming language implementations. In practice, what often happens is that, once an interpreted language becomes popular, pressure builds to improve performance until eventually a project is undertaken to implement a native Just In Time (JIT) compiler for the language. Implementing a JIT is usually a large effort, affects a significant part of the existing language implementation, and adds a significant amount of code and complexity to the overall code base."

In FIG. 1B, an example of a prior art emulated Host Computer system 21 may be provided that emulates a Host computer system 50 of a Host architecture. In the emulated Host Computer system 21, the Host processor (CPU) 1 may be an emulated Host processor (or virtual Host processor) and comprises an emulation processor 27 having a different native instruction set architecture than that of the processor 1 of the Host Computer 50. The emulated Host Computer system 21 has memory 22 accessible to the emulation processor 27. In the example embodiment, the Memory 27 may be partitioned into a Host Computer Memory 2 portion and an Emulation Routines 23 portion. The Host Computer Memory 2 may be available to programs of the emulated Host Computer 21 according to Host Computer Architecture. The emulation Processor 27 executes native instructions of an architected instruction set of an architecture other than that of the emulated processor 1, the native instructions obtained from Emulation Routines memory 23, and may access a Host instruction for execution from a program in Host Computer Memory 2 by employing one or more instruction(s) obtained in a Sequence & Access/Decode routine which may decode the Host instruction(s) accessed to determine a native instruction execution routine for emulating the function of the Host instruction accessed. Other facilities that are defined for the Host Computer System 50 architecture may be emulated by Architected Facilities Routines, including such facilities as General Purpose Registers, Control Registers, Dynamic Address Translation and I/O Subsystem support and processor cache for example. The Emulation Routines may also take advantage of function available in the emulation Processor 27 (such as general registers and dynamic translation of virtual addresses) to improve performance of the Emulation Routines. Special Hardware and Off-Load Engines may also be provided to assist the processor 27 in emulating the function of the Host Computer 50.

In a mainframe, architected machine instructions are used by programmers, usually today "C" programmers often by way of a compiler application. These instructions stored in the storage medium may be executed natively in a z/Architecture IBM Server, or alternatively in machines executing other architectures. They can be emulated in the existing and in future IBM mainframe servers and on other machines of IBM (e.g. pSeries® Servers and xSeries® Servers). They can be executed in machines running Linux on a wide variety of machines using hardware manufactured by IBM®, Intel®, AMD™, Sun Microsystems and others. Besides execution on that hardware under a Z/Architecture®, Linux can be used as well as machines which use emulation by Hercules, UMX, FSI (Fundamental Software, Inc) or Platform Solutions, Inc. (PSI), where generally execution may be in an emulation mode. In emulation mode, emulation software may be executed by a native processor to emulate the architecture of an emulated processor.

The native processor 27 typically executes emulation software 23 comprising either firmware or a native operating system to perform emulation of the emulated processor. The emulation software 23 may be responsible for fetching and executing instructions of the emulated processor architecture. The emulation software 23 maintains an emulated program counter to keep track of instruction boundaries. The emulation software 23 may fetch one or more emulated machine instructions at a time and convert the one or more emulated machine instructions to a corresponding group of native machine instructions for execution by the native processor 27. These converted instructions may be cached such that a faster conversion can be accomplished. Not withstanding, the emulation software must maintain the architecture rules of the emulated processor architecture so as to assure operating systems and applications written for the emulated processor operate correctly. Furthermore the emulation software must provide resources identified by the emulated processor 1 architecture including, but not limited to control registers, general purpose registers, floating point registers, dynamic address translation function including segment tables and page tables for example, interrupt mechanisms, context switch mechanisms, Time of Day (TOD) clocks and architected interfaces to I/O subsystems such that an operating system or an application program designed to run on the emulated processor, can be run on the native processor having the emulation software.

A specific instruction being emulated may be decoded, and a subroutine called to perform the function of the individual instruction. An emulation software function 23 emulating a function of an emulated processor 1 may be implemented, for example, in a "C" subroutine or driver, or some other method of providing a driver for the specific hardware as will be within the skill of those in the art after understanding the description of the preferred embodiment. Various software and hardware emulation patents including, but not limited to U.S. Pat. No. 5,551,013 for a "MULTIPROCESSOR FOR HARDWARE EMULATION" of Beausoleil et al.; and U.S. Pat. No. 6,009,261 "PREPROCESSING OF STORED TARGET ROUTINES FOR EMULATING INCOMPATIBLE INSTRUCTIONS ON A TARGET PROCESSOR" of Scalzi et al; and U.S. Pat. No. 5,574,873 "DECODING GUEST INSTRUCTION TO DIRECTLY ACCESS EMULATION ROUTINES THAT EMULATE THE GUEST INSTRUCTIONS" of Davidian et al; and U.S. Pat. No. 6,308,255 "SYMMETRICAL MULTIPROCESSING BUS AND CHIPSET USED FOR COPROCESSOR SUPPORT ALLOWING NON-NATIVE CODE TO RUN IN A SYSTEM" of Gorishek et al; and U.S. Pat. No. 6,463,582 "DYNAMIC OPTIMIZING OBJECT CODE TRANSLATOR FOR ARCHITECTURE EMULATION AND DYNAMIC OPTIMIZING OBJECT CODE TRANSLATION METHOD" of Lethin et al; and U.S. Pat. No. 5,790,825 "METHOD FOR EMULATING GUEST INSTRUCTIONS ON A HOST COMPUTER THROUGH DYNAMIC RECOMPILATION OF HOST INSTRUCTIONS" of Eric Traut, each of which are incorporated by reference herein, and many others, illustrate the a variety of known ways to achieve emulation of an instruction format architected for a different machine for a target machine available to those skilled in the art, as well as those commercial software techniques used by those referenced above.

U.S. Pat. No. 5,953,520 "Address Translation Buffer for Data Processing System Emulation Mode", (Mallick) assigned to IBM, Filed Sep. 22, 1997 and incorporated herein by reference, teaches a processor and method of operating a processor which has a native instruction set and emulates instructions in a guest instruction set are described. According to the method, a series of guest instructions from the guest instruction set are stored in memory. The series includes a guest memory access instruction that indicates a guest logical address in guest address space. For each guest instruction in the series, a semantic routine of native instructions from the native instruction set may be stored in memory. The semantic routines, which utilize native addresses in native address space, can be executed in order to emulate the guest instructions. In response to receipt of the guest memory access instruction for emulation, the guest logical address may be translated into a guest real address, which may be thereafter translated into a native physical address. A semantic routine that emulates the guest memory access instruction may be then executed utilizing the native physical address.

SUMMARY OF THE INVENTION

A Host processor having a Host memory includes an emulation program for emulating the function of a Guest processor architecture so that programs such as Operating Systems (OS)s and Application Programs (i.e. object code or machine instructions) designed to run on processors of the Guest processor are able to also run on the Host processor having a different architecture. Each architecture may have a machine instruction set that is incompatible with the machine instruction set of the other architecture. One responsibility of the emulation program is to translate Guest instructions of Guest programs to a form that is executable by the Host processor. There are many mechanisms to perform the translation known in the art including but not limited to manual pre-translation, object code to object code compiler, Just-in-time (JIT) compiler just to name a few.

The present invention provides a novel mapping of Guest cells of Guest pages of Guest memory to Host cells of Host memory, wherein a Guest cell may include all or part of a Guest machine instruction and the corresponding Host cell may include all or part of a semantic routine for emulating the Guest machine instruction.

In one aspect of the invention, the processor comprises an instruction fetching element for fetching instructions from memory and one or more execution elements for executing fetched instructions. The processor performs a method comprising: a) creating a cell association wherein each of n Guest cells of Guest addressable memory are associated with a corresponding Host cell of n Host cells of Host addressable memory, each of said n Guest cells corresponding to an opcode (beginning) portion of a Guest instruction to be emulated, wherein each Guest cell is Guest cell is x bytes of memory, wherein each Host cell is y bytes of memory, b) initializing each Host cell associated with a first Guest cell of each Guest instruction with an initialization routine, c) responsive to the emulator determining that a Guest instruction is to be emulated, the emulator causing the corresponding Host cell to be executed comprising: c1) responsive to the corresponding Host cell having the initialization routine, executing the initialization routine of the corresponding Host cell, the execution causing the Host processor to patch the initialized Host cell with a semantic routine for executing the corresponding Guest instruction of the first Guest cell, and c2) responsive to the corresponding Host cell having the semantic routine, executing the semantic routine to perform the function of the Guest instruction.

In another aspect of the invention, the initialization routine comprises a branch instruction to a common handler routine, the method further comprises executing the common handler routine to determine the appropriate semantic routine with which to patch the initialized Host cell.

In another aspect of the invention, the semantic routine comprises a branch instruction to an emulation routine, the method further comprises: executing the branch instruction, and then executing the emulation routine to perform function for the Guest instruction.

In another aspect of the invention, the semantic routine of the Host cell comprises semantic routine elements in Host cells corresponding to a plurality of Guest cells of the Guest instruction.

In another aspect of the invention, the semantic routine of the Host cell emulates a plurality of Guest instructions.

In another aspect of the invention, the semantic routine comprises a branch instruction to a target Host cell comprising executing the semantic routine to emulate execution of the corresponding Guest instruction, based on the branch instruction to the target Host cell, branching to the target Host cell, and executing a semantic routine of the target Host cell to emulate execution of a Guest instruction corresponding to the target Host cell.

In another aspect of the invention, each Host cell associated with each of a plurality of Guest cells of each Guest instruction is initialized with the initialization routine.

In another aspect of the invention, the determining that a Guest instruction is to be emulated further comprises: obtaining a lock before causing the initialization routine of the corresponding Host cell to be executed, preventing other threads or other processors from executing the initialization routine responsive to the obtained lock is held, and releasing the lock responsive to the initialization routine no longer needing the lock.

The above as well as additional objectives, features, and advantages of the present invention will become apparent in the following written description.

Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which may be regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 10-20 depict embodiments of execution cells;

DESCRIPTION OF THE INVENTION

Figure 1A:
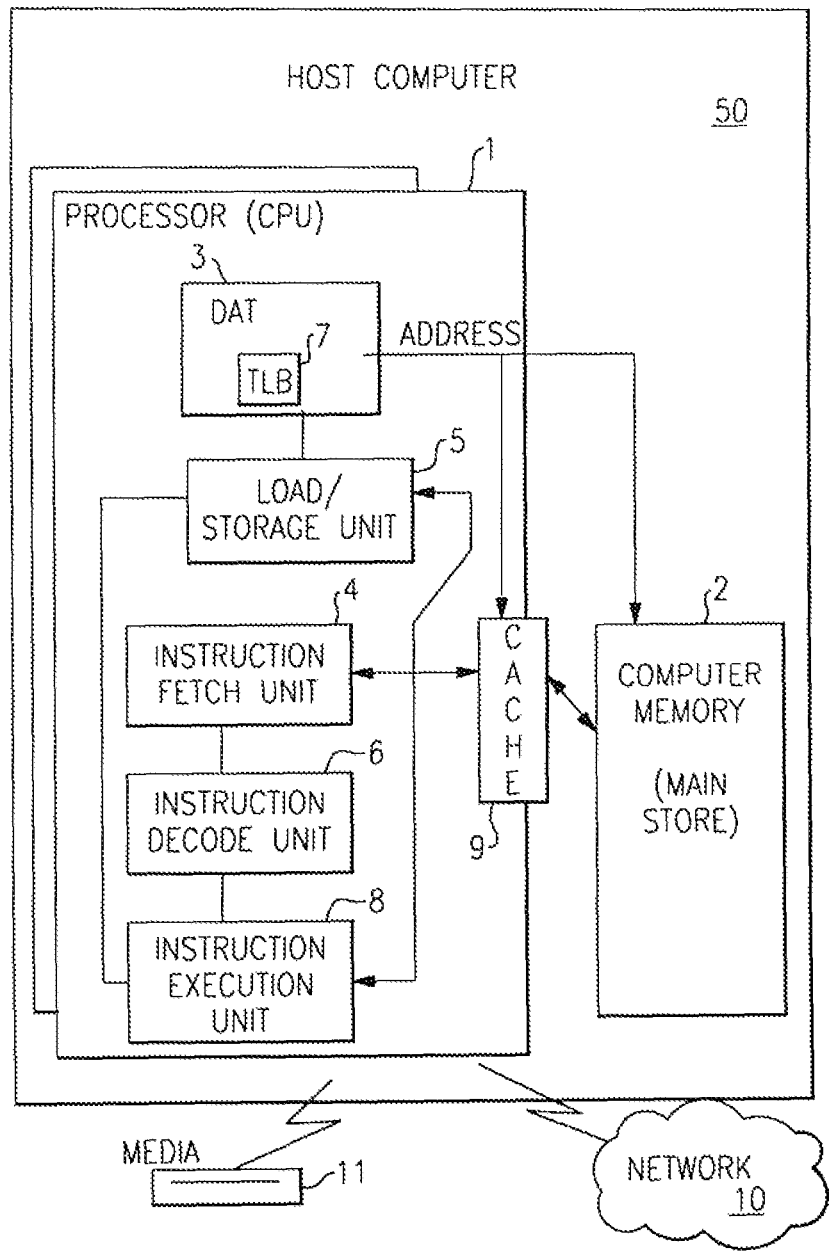
FIG. 1A is a diagram depicting an example Host computer system (processor (CPU)) of the prior art.
Figure 1B:
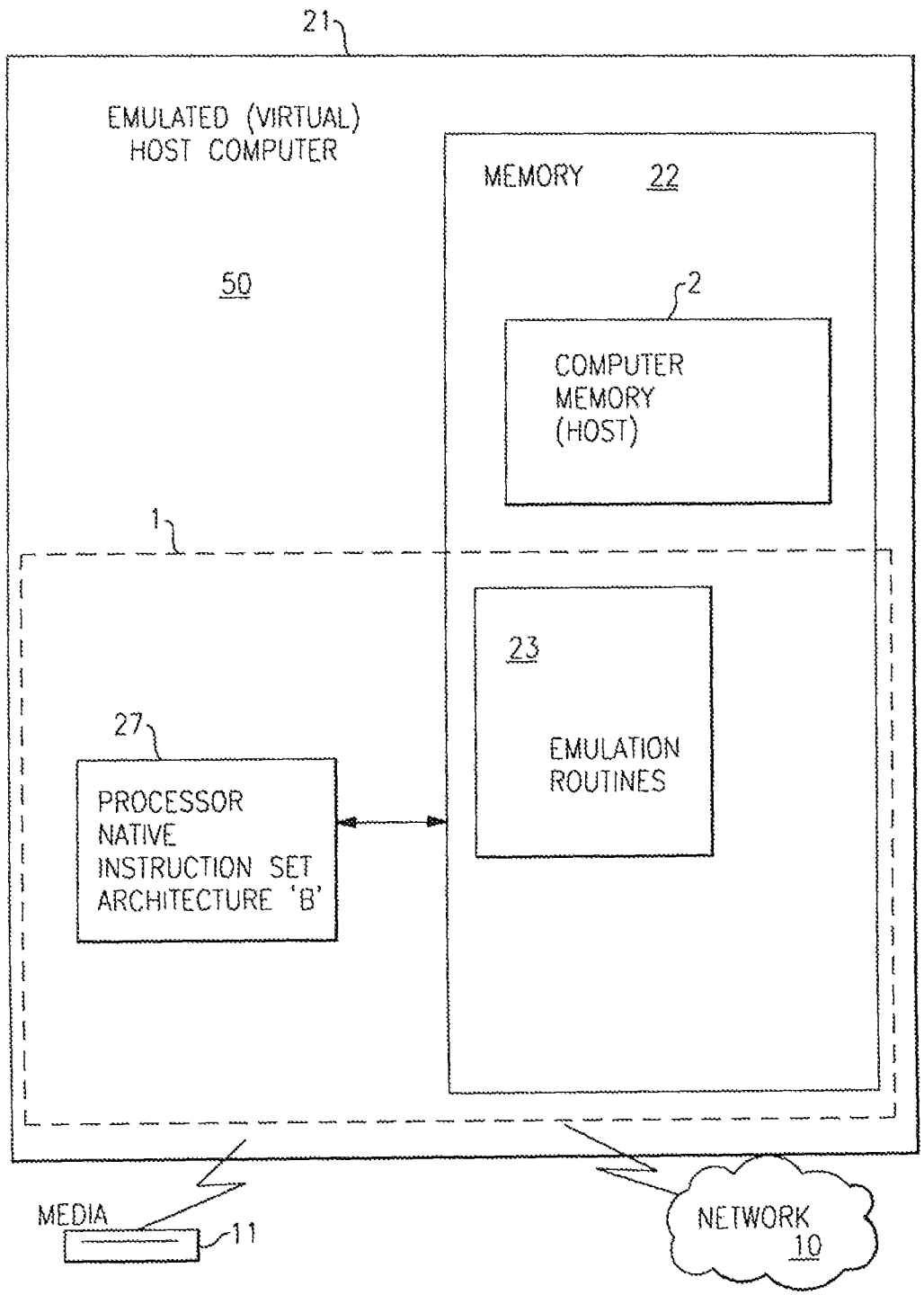
FIG. 1B is a diagram depicted an example Guest (Emulated) computer system of the prior art.

In an embodiment, the invention may be practiced by software (sometimes referred to Licensed Internal Code, Firmware, Micro-code, Milli-code, Pico-code and the like, any of which would be consistent with the present invention). Referring to FIG. 1A, software program code which embodies the present invention may be typically accessed by the processor also known as a CPU (Central Processing Unit) 1 of the system 50 from long-term storage media 7, such as a CD-ROM drive, tape drive or hard drive. The software program code may be embodied on any of a variety of known media for use with a data processing system, such as a diskette, hard drive, or CD-ROM. The code may be distributed on such media, or may be distributed to users from the computer memory 2 or storage of one computer system over a network 10 to other computer systems for use by users of such other systems.

Alternatively, the program code may be embodied in the memory 2, and accessed by the processor 1 using the processor bus. Such program code includes an operating system which controls the function and interaction of the various computer components and one or more application programs. Program code may be normally paged from dense storage media 11 to high-speed memory 2 where it may be available for processing by the processor 1. The techniques and methods for embodying software program code in memory, on physical media, and/or distributing software code via networks are well known and will not be further discussed herein. Program code, when created and stored on a tangible medium (including but not limited to electronic memory modules (RAM), flash memory, Compact Discs (CDs), DVDs, Magnetic Tape and the like is often referred to as a "computer program product". The computer program product medium is typically readable by a processing circuit preferably in a computer system for execution by the processing circuit.

Figure 1C:
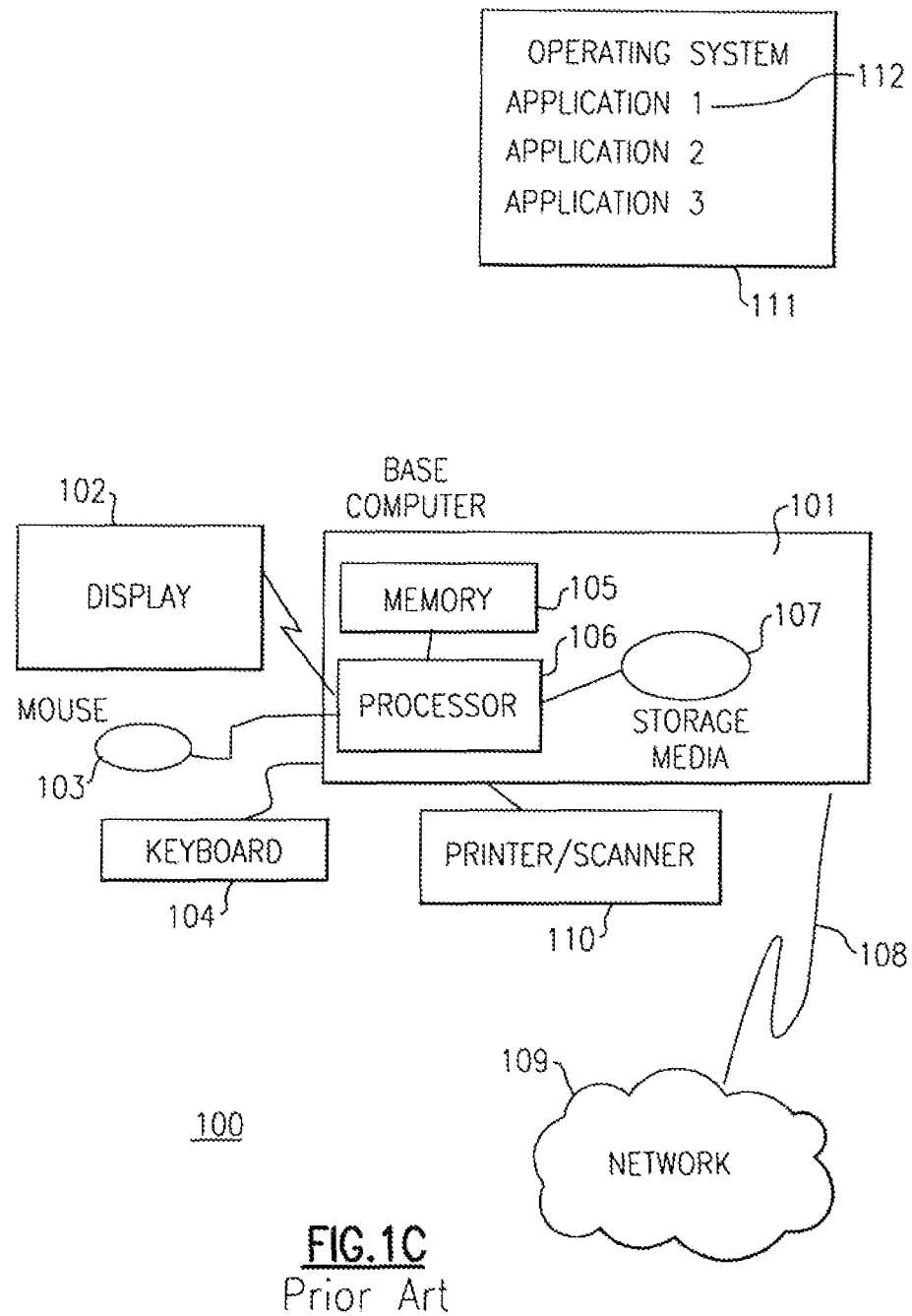
FIG. 1C is a diagram depicting prior art components of a computer system.

FIG. 1C illustrates a representative workstation or server hardware system in which the present invention is practiced. The system 100 of FIG. 1C comprises a representative computer system 101, such as a personal computer, a workstation or a server, including optional peripheral devices. The workstation 101 includes one or more processors 106 and a bus employed to connect and enable communication between the processor(s) 106 and the other components of the system 101 in accordance with known techniques. The bus connects the processor 106 to memory 105 and long-term storage 107 which can include a hard drive (including any of magnetic media, CD, DVD and Flash Memory for example) or a tape drive for example. The system 101 might also include a user interface adapter, which connects the microprocessor 106 via the bus to one or more interface devices, such as a keyboard 104, mouse 103, a Printer/scanner 110 and/or other interface devices, which can be any user interface device, such as a touch sensitive screen, digitized entry pad, etc. The bus also connects a display device 102, such as an LCD screen or monitor, to the microprocessor 106 via a display adapter.

The system 101 may communicate with other computers or networks of computers by way of a network adapter capable of communicating 108 with a network 109. Example network adapters are communications channels, token ring, Ethernet or modems. Alternatively, the workstation 101 may communicate using a wireless interface, such as a CDPD (cellular digital packet data) card. The workstation 101 may be associated with such other computers in a Local Area Network (LAN) or a Wide Area Network (WAN), or the workstation 101 can be a client in a client/server arrangement with another computer, etc. All of these configurations, as well as the appropriate communications hardware and software, are known in the art.

Figure 2:
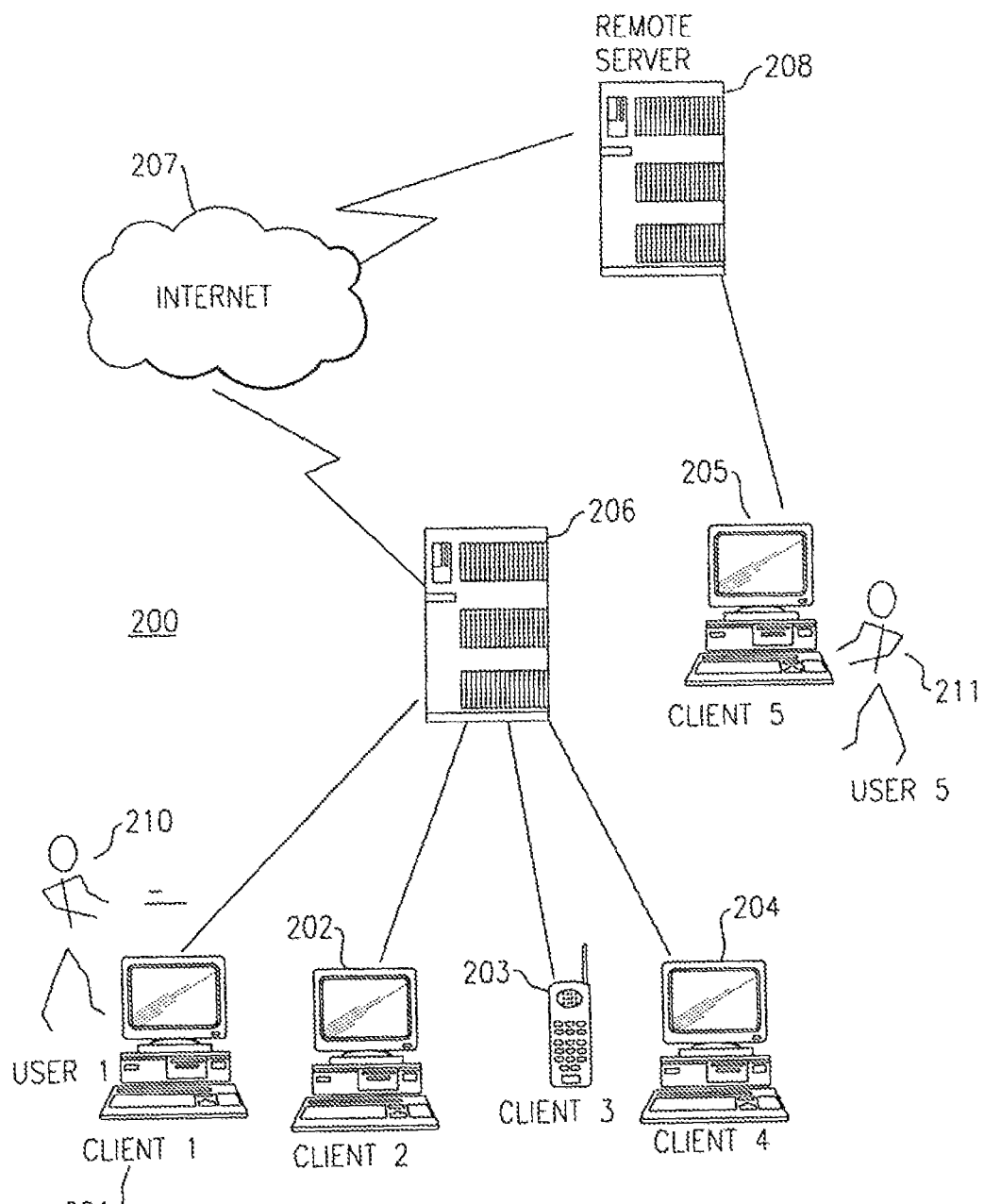
FIG. 2 is a diagram depicting a prior art network of computer systems.

FIG. 2 illustrates a data processing network 200 in which the present invention may be practiced. The data processing network 200 may include a plurality of individual networks, such as a wireless network and a wired network, each of which may include a plurality of individual workstations 101 201 202 204 or a phone 203. Additionally, as those skilled in the art will appreciate, one or more LANs may be included, where a LAN may comprise a plurality of intelligent workstations coupled to a host processor.

Still referring to FIG. 2, the networks may also include mainframe computers or servers, such as a gateway computer (client server 206) or application server (remote server 208 which may access a data repository and may also be accessed directly from a workstation 205). A gateway computer 206 serves as a point of entry into each network 207. A gateway may be needed when connecting one networking protocol to another. The gateway 206 may be preferably coupled to another network (the Internet 207 for example) by means of a communications link. The gateway 206 may also be directly coupled to one or more workstations 101 201 202 203 204 using a communications link. The gateway computer may be implemented utilizing an IBM eServer™ zSeries® z9® Server available from IBM Corp.

Software programming code which embodies the present invention may be typically accessed by the processor 106 of the system 101 from long-term storage media 107, such as a CD-ROM drive or hard drive. The software programming code may be embodied on any of a variety of known media for use with a data processing system, such as a diskette, hard drive, or CD-ROM. The code may be distributed on such media, or may be distributed to users 210 211 from the memory or storage of one computer system over a network to other computer systems for use by users of such other systems.

Alternatively, the programming code 111 may be embodied in the memory 105, and accessed by the processor 106 using the processor bus. Such programming code includes an operating system which controls the function and interaction of the various computer components and one or more application programs 112. Program code may be normally paged from dense storage media 107 to high-speed memory 105 where it may be available for processing by the processor 106. The techniques and methods for embodying software programming code in memory, on physical media, and/or distributing software code via networks are well known and will not be further discussed herein. Program code, when created and stored on a tangible medium (including but not limited to electronic memory modules (RAM), flash memory, Compact Discs (CDs), DVDs, Magnetic Tape and the like are often referred to as a "computer program product". The computer program product medium may be typically readable by a processing circuit preferably in a computer system for execution by the processing circuit.

In an emulation environment, a Host or Native processor may be provided with emulation code 23. Emulation code is software that runs on the Host processor to provide an interface to Guest programs (Guest Operating systems, Guest Application Programs and the like) such that the Guest programs (written for an architecture other than that of the Host processor architecture) can execute on the Host processor as if it were a Guest processor having the Guest architecture. In an example, a Host processor such as a PowerPC® 27 from IBM® may be provided with Emulation software (code) 23 that interprets programs written for a s/390® from IBM into PowerPC routines (semantic routines) 23 that "emulate" the s/390 instructions of a Guest s/390 computer system 50 and functions on the Host Pentium processor 27. The emulation code may provide a variety of functions, including managing the Host partition (image) that may be provided to the guest (sometime called a Hypervisor function), performing Guest architecture functions such as Guest dynamic address translation, providing Guest architecture facilities such as control registers, TOD clocks etc., providing Guest virtual to Host real address translation or providing Guest to Host instruction interpretive functions. Typically, a semantic routine is provided by the emulation code that executes the function of a corresponding Guest machine instruction in Host instructions on the Host processor (Host Central Processing Unit (CPU)). The emulation code further supports fetching of Guest instructions to be emulated and interpreting the fetched instruction to determine the corresponding semantic routine as well as calling the corresponding semantic routine to be executed to "emulate" the execution of the Guest instruction. Various techniques have been proposed to perform the emulation function. A goal may be to reduce the emulation code overhead in order to improve performance. One performance advantage can be achieved by re-using the translated code rather than translating each time the Guest instruction is encountered.

The present invention, in a preferred embodiment, dynamically interprets a Guest instruction(s) in one or more "cells" of Guest real memory and utilizes a corresponding cell(s) location in Host real memory to hold at least a portion of the semantic routine that emulates the Guest instruction(s). This may be done by, for example providing a Host cell location for each halfword (2 bytes or 16 bits) of a Guest instruction (where the Guest instructions may be a variable length instruction). When the Guest instruction is first executed, the emulation code (semantic routine) in a Host cell may be executed, wherein the Host cell corresponds to the Guest cell having the first halfword of the Guest instruction. The Host cell may be preferably initialized to have code that branches to a common handler to interpret the Guest instruction and over-write the Host cell with the semantic routine customized to emulate the Guest instruction. The semantic routine loaded in the Host cell may comprise a branch instruction for branching to a specific handler for handling any one of the specific Guest instruction, the type of Guest instruction, or the whole semantic routine could reside in the Host cell(s) corresponding to the Guest instruction.

In another embodiment, the Host cells corresponding to a Guest instruction can be loaded with emulation routines to handle wild branches for the case where a branch may be taken to a portion of a Guest instruction other than the beginning portion.

In an embodiment, when a semantic routine emulating a Guest instruction may be executed, the semantic routine preferably includes a return instruction (a branch instruction) whereby the return instruction, either branches back to the emulation code to obtain a next instruction, branches directly to a target Host semantic routine corresponding to a target Guest instruction or "falls thru" directly to a Host cell having a next semantic routine corresponding to a next sequential Guest instruction. Thus, in certain cases, several Guest instructions might be emulated by executing several semantic routines without any intervening emulation code translation of the Guest instructions.

In an embodiment, a plurality of Guest instructions are implemented in a common semantic routine. Each of the Guest instructions are mapped to corresponding Host cells, however when the first Host cell is executed, it performs the function of the plurality of Guest instructions in a single semantic routine. Preferably, if any Host cell other than the first Host cell is executed (such as the case where there is a branch to one of the Guest instructions in the plurality other than the first Guest instruction), the corresponding Host cells other than the first Host cell implement semantic routines of the individual Guest instruction of the plurality of Guest instructions.

The portion of the emulation activity involved in interpreting the Guest instruction(s) to emulate the Guest processor may in one embodiment emulate the function of an instruction fetch unit, a Dynamic Address Translation storage unit, a Translation Lookaside Buffer unit and dispatch unit of a hardware processor.

Prior art Emulation interpreters may use an interpreter-loop to step through units of work (byte-code, assembler instructions etc). The interpreter loop fetches the next unit of work (such as a Guest instruction to be executed), decodes it, and then calls a handler routine that implements a specific instance of work (emulation semantic routine). Typical hardware pipelines of a Host processor do not behave very well for such an environment, as the dispatching branch in the loop may be indirect and cannot be well predicted due to the large set of targets that implement the many different work units. For Example:

```
for(;;) {
  wu = fetch_next_work_unit(address);
  address += size_of(wu);
  address = call_work_unit_handler(wu);   // poorly predicted branch
  }
```

The present invention provides a methodology for improving the performance of interpretation by removing the unpredictable branch behavior.

Context Threaded Interpreters

The present invention reduces branch-penalties for virtual-machine (VM) based languages like OCaml and Java®. In an embodiment of the invention a binary translation environment may be used. As a result, this embodiment provides methodologies for:

1. building a self-modifying execution environment based on the logical mapping of emulate-to-native instructions, 2. handling emulated branches into the middle of instructions, and 3. handling concurrency of execution.

Additionally, the present invention provides a spatially aware interpreter capable of interacting with a traditional trace-based JIT compiler. An example JIT compiler compiles a selected group of guest machine instructions into a host semantic routine that is directly executable by a host processor The selected group of guest instructions may be referred to as a "trace", although the term "trace" may also include the corresponding host semantic routine. The trace is to be compiled by the JIT compiler into a semantic routine to be executed by the host processor to emulate the corresponding trace. In an embodiment the JIT compiler may merely detect familiar sequences (traces) of guest instructions and map them to pre-designed semantic routines to be executed by the Host processor, where the pre-designed semantic routines have been created in Host instructions and kept in a table (cached) with an association with the corresponding Guest trace along with implementation dependent metadata providing parameters for the semantic routine.

In one embodiment (FIG. 6) an emulated Guest processor comprising a Virtual memory, presents "logical" or "virtual" addresses to programs. These addresses may be translated on a page basis to pages of memory ("real" addresses of real memory). Some of the pages may be present in the memory but others are not. The Operating System (OS) "pages" fixed sized blocks of data between a peripheral mass storage and processor memory to make it appear as if the whole amount of virtual memory is resident. Thus, the processor memory acts as a cache for addressable virtual storage. The present invention (FIG. 21) works through a page-mapped set of Guest execution-cells 2101. A single (a, b etc) or a set of Guest execution cells maps 2103 2104 to the absolute location of work unit being interpreted (A, B etc). When a new Guest page 2101 (4 Kbytes in an embodiment) of Guest work-units (a-l) is first loaded into Guest processor memory for execution, an associated Host logical page 2102 of execution cells (A-L) is created. Each Guest page is made up of a number of Guest cells (in an example, each Guest cell (a-l) is 2 halfwords of the Guest page). Each Host cell of the associated Host logical page is a predetermined size and is associated with a Guest cell. The interpreter maintains a look-aside table for the page mapping from Guest work unit to Host execution unit pages. In an embodiment a Host execution cell and Host page are both larger than one or both of the Guest cell and the Guest page. A Host execution cell preferably is large enough to hold a simple dispatch sequence. Additionally, there must be at least one Host execution cell for each possible location of a Guest work-unit. Hence the smallest Guest work-unit dictates the number or execution units per Guest page. In the mainframe environment, instructions may be 2, 4 or 6 bytes long, therefore the Guest work-unit is 2 bytes. z/Architecture from IBM provides various levels of addressing. A "Real address" of a page may subject to relocation to an "Absolute address" of the page in memory based on a relocation value. This permits the OS in a partition to provide each processor with a real address range that has a processor unique portion (containing the processor's program counter) allocated to each processor transparent to the processor. The Absolute address may further be relocated in order to map multiple partitions (images) into physical memory being the actual hardware address. Other architectures may implement address relocation equivalent to more of these addresses or only 1 or 2 of them . The present specification will refer to Real addresses to differentiate between Virtual address (logical address) and physical address (Real or Absolute), not differentiating between Absolute and Real.

Figure 8:
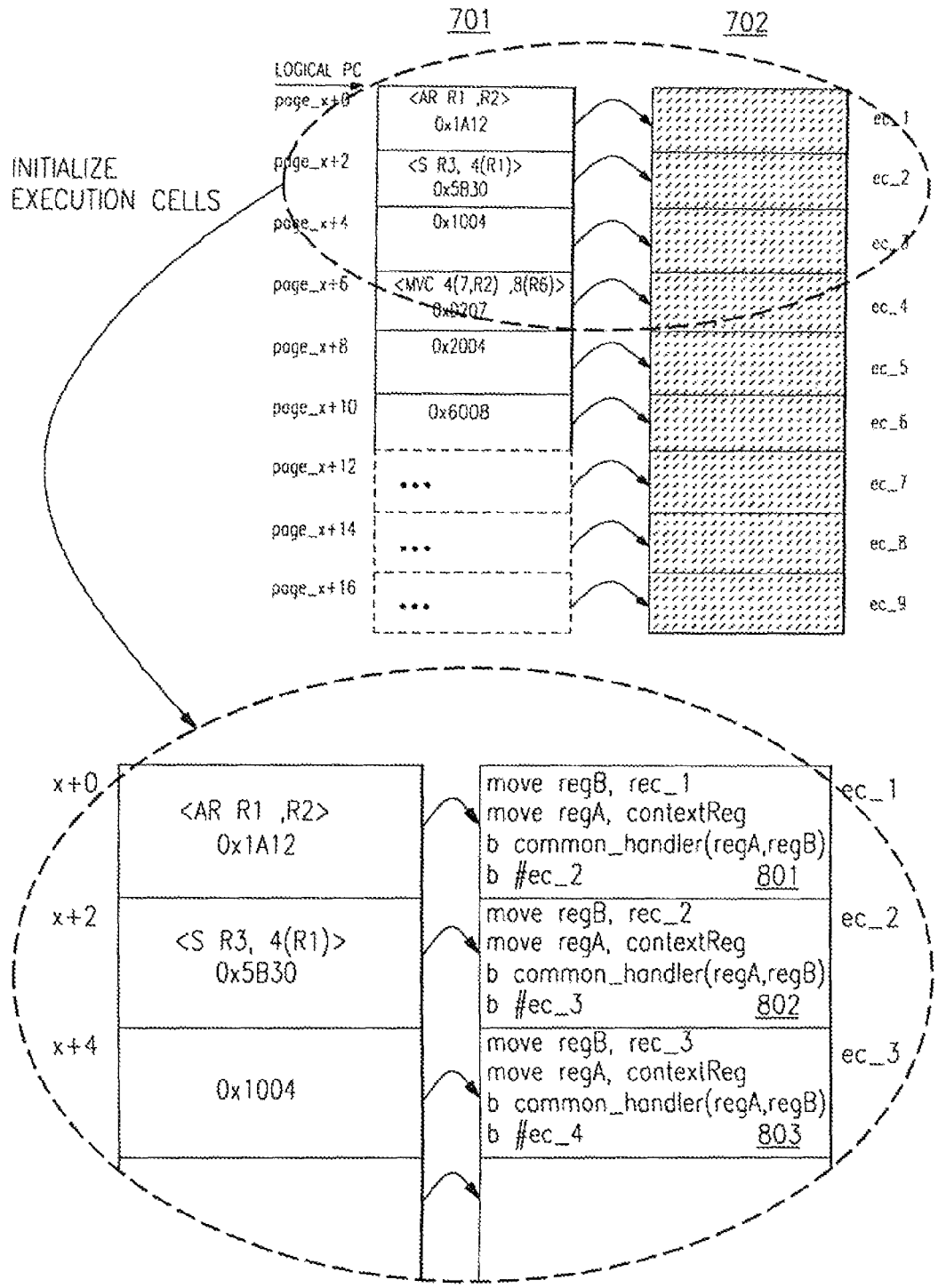
FIG. 8 depicts initialized execution cells.

Preferably the mapping can be described as:

ec_address=wu_to_ec_page_table(page(wu))+size_of_cell*(wu−page(wu))/min_wu_size;

wu_address=ec_to_wu_page_table(page(ec))+min_wu_size*(ec−page(ec))/size_of_cell;

Preferably when a Guest page is paged into processor memory, a corresponding Host page of Host execution cells is created, each of the Host execution cells FIG. 8 801 of the Host page may be initialized with a simple assembly sequence that dispatches to a common handler. This common handler, when executed, decodes the work unit (the Guest instruction) that maps to the given Host execution cell and then patches this execution-cell 801 to provide the Host semantic routine for executing the function of the Guest instruction, in an example the Host execution cell may be patched to provide a call to the given work unit handler (specific semantic routine).

```
common_handler(context, ec_address, ...) {
    // Decode the wu that maps to ec_address
    wu = decode_work_unit(ec_address);
    // Find the wu_handler for the given wu
         wu_handler = lookup_handler(wu);
    // patch the dispatch sequence to call wu_handler
    // and have the return address jump to the next execution-cell
    // (based on the size of the associated work-unit).
         patch_execution_cell(wu_handler, ec_address);
    // invoke the updated version of the cell
         dispatch_to_ec(context, ec_address, ...);
}
```

A preferred work-unit handler will manipulate the interpreter's context (registers, status and memory will be updated according to the work-unit), and will then return to the execution cell to the instruction following the handler dispatch. In an embodiment, the instruction following the handler dispatch may be a branch that jumps to the next expected Guest execution-cell. The common-handler may update this branch based on the decoded work-unit. As the length of the work-unit is known, the next execution-unit is also known.

Example execution cell at initialization:

```
...
label_cell_n:
branch-and-link common_handler(context, ec_address);
ec_address = label_cell_n+1
branch label_cell_n+1
label_cell_n+1:
...
```

Example execution cell after its initialized code is executed:

```
...
label_cell_n:
branch-and-link ADD_handler(context);
ec_address = label_cell_n+4
branch label_cell_n+4      // the ADD work unit is 4 cells in length
label_cell_n+1:
    ...
```

In-lining Work Units into Execution Cell

For simpler work units, it may be possible to avoid calling the work unit handler if the implementation of the work unit can be completely represented in the respective Guest execution cell. For instance, an execution cell implementation of the add handler for an add work unit (result=operand1+operand2) could look like this after the initialization code has been executed . . .

```
label_cell_n:
*context->add_result_location =
     *context->add_operand_one_location +
     *context->add_operand_two_location
ec_address = label_cell_n+4
branch label_cell_n+4
label_cell_n+1:
...
```

In one embodiment, Host execution cells are 32 Bytes and Guest cells are 2 Bytes, the Host execution cells may be made even larger for the purpose of allowing more aggressive in-lining of work units (permitting semantic routines for some Guest instructions to fit entirely in a single Host execution cell).

In another embodiment an emulator could use a plurality of the Host execution cells allotted to a Guest variable length instruction to hold an entire Host semantic routine in order to provide better performance.

When populating an execution cell the handler could look ahead at subsequent instructions and then either encode a call to a native routine that emulates the behavior of these multiple guest instructions (or even inline the native instructions in the cell—dependent on size constraints). This native routine could either be based on a pre-compiled template or constructed from scratch each time based on the guest instructions.

As the handler would know how many instructions it has grouped together a branch to the next guest instruction after the group could be encoded following the grouped instruction execution.

Execution cells for guest instructions included in the group compile would be left with the generic instruction sequence that includes a branch to the common handler. Therefore if these instructions are encountered they could either be encoded as a stand-alone instruction or form the start of a new instruction group to be sent to the compiler.

In an embodiment, a spatially aware interpreter may be a jumping off point to a more traditional JIT compiler where multiple instructions are sent to the compiler as a group. A difference here is that there wouldn't necessarily have to be a 'recording phase' concurrent with interpretation to form this trace. Instead the handler itself could figure out the instructions to compile before they have been executed once.

In the context of branches, the common_handler provides a unique opportunity for managing the interaction of the page-mapped execution environment with either a more traditional interpreter or a Just-In-Time (JIT) compiler. The common_handler provides an interface for implementing new trace discovery policy. In combination with code re-use/hotness mechanisms, this interface that can be used for directing the execution back to a traditional looped interpreter, more page-mapped translation, or potentially could invoke a JIT to perform and execute more aggressive compilation of the trace.

Figure 20:
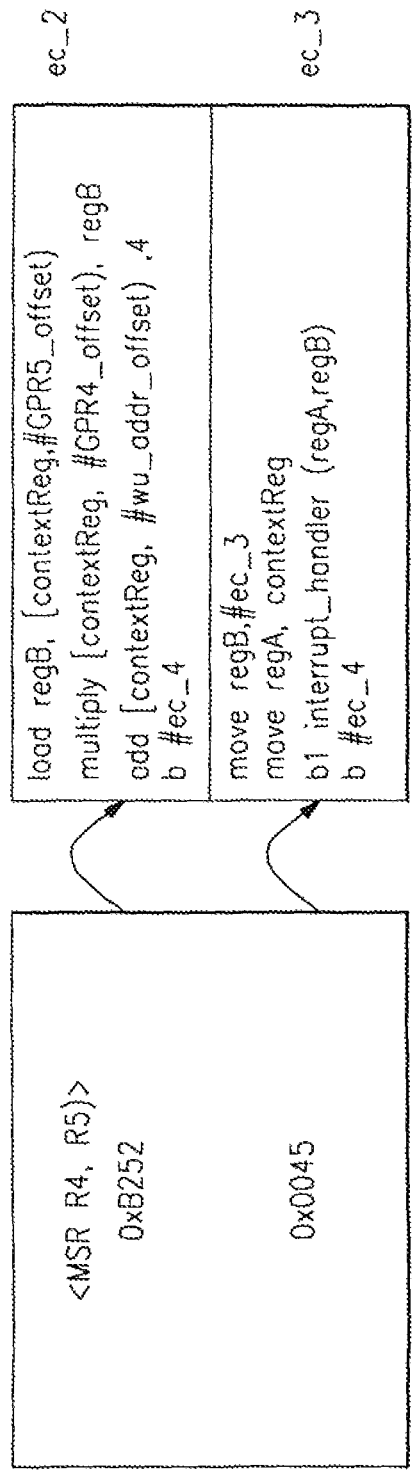

In an embodiment, the situation exists where a Guest branch target lands in the middle of a set of Host cells that represent a specific instruction. If, for example, a branch were to target the address that maps to cell C in the example in the FIG. 20, incorrect behavior could ensue as the cell could hold the initial un-modified generic handler sequence or a partial set representation of the instruction a 'b'.

Figure 21:
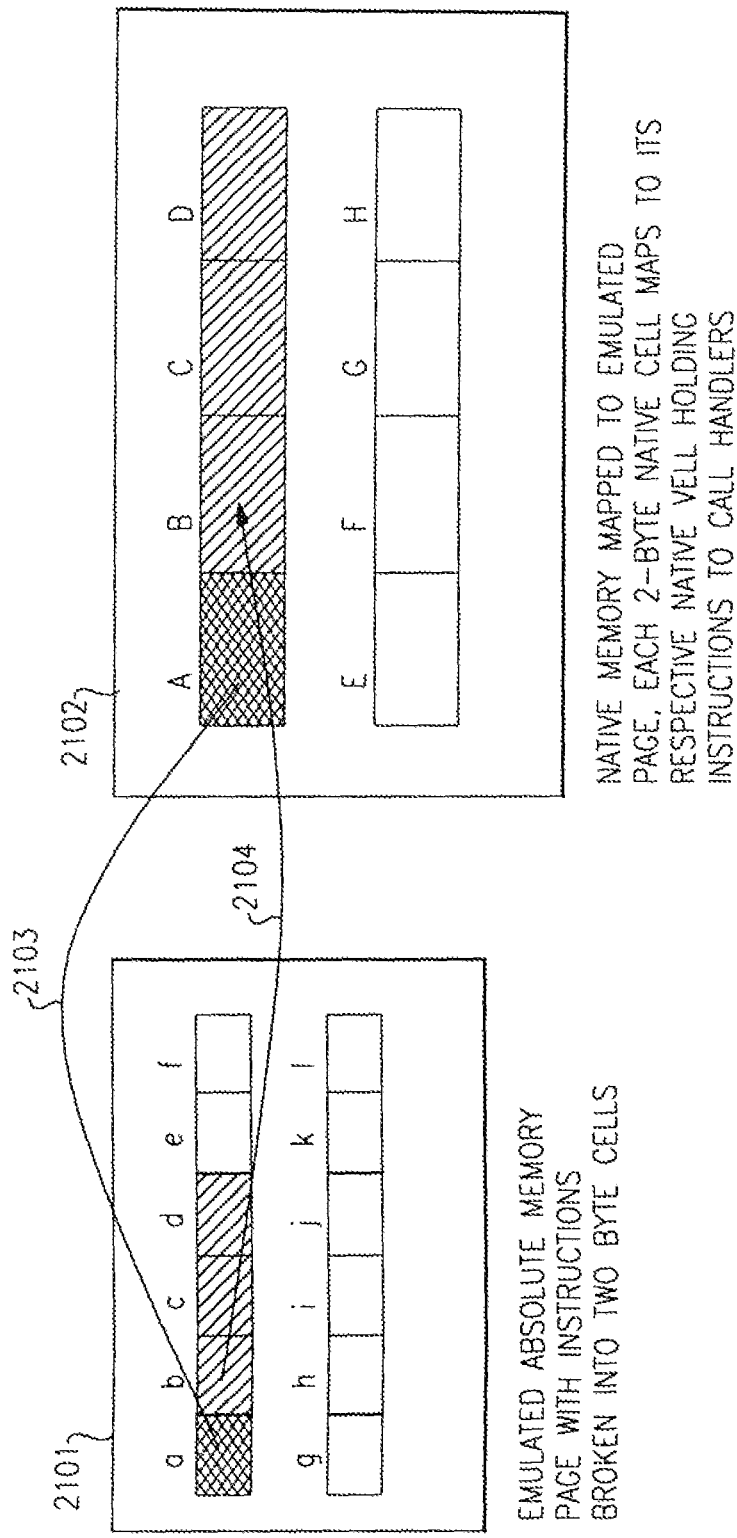
FIG. 21 depicts mapping of Guest cells to Host cells.

Referring to FIG. 21, Cell 'a' holds a 2-byte inst. in emulated memory. Cell 'a' maps to execution cell 'A' in native memory which holds self-modifying code for dispatching to the handler of the instruction represented in 'a'.

Cells 'b, c, d' is a 6-byte inst. Cells 'b, c, d' map to execution cells 'B C D' in native memory which hold self-modifying code for dispatching to the handler of the instruction represented in 'b, c, d'. Cells 'C' and 'D' hold code to return to the interpreter to correctly emulate a mid-instruction branch target.

In an embodiment, multiple Host cells (super-cells) are used to perform a function where the Guest instruction occupies multiple Guest cells that map to multiple Host cells.

In an embodiment where super-cells are not used, Cells 'b, c, d' represents a 6-byte Guest instruction. Cells 'b, c, d' map to Host execution cells 'B, C, D' in native memory which hold self-modifying code for dispatching to the handler of the instruction represented in 'b, c, d'. Cells 'C' and 'D' hold code to return to the interpreter to correctly emulate a mid-instruction branch target. Cells C and D hold a special dispatch sequence that dispatches to a handler for mid-instruction targets. This handler returns execution to the interpreter.

In an embodiment where super-cells are used, a bit map is used for example:

Bit map: <(A:0), (B:0), (C:1), (D:1), (E:0), (F:0), (G:0), (H:0)>

Cells 'b, c, d' represent a 6-byte Guest inst. Cells 'b, c, d' map to execution cells 'B C D' in native memory which hold self-modifying code for dispatching to the handler of the instruction represented in 'b, c, d'. Cells 'C' and 'D' hold code to return to the interpreter to correctly emulate a mid-instruction branch target. Cells C and D hold super-cell instructions representing the function for instruction 'b'. A bit map representing cells A through H shows that cells C and D are not legal targets and hence any branch that targets these cells should revert to interpretation.

In an embodiment, if super-cells are not used, only the first cell is used to dispatch to the appropriate handle. Subsequent cells belonging to the same instruction can be filled with a special handler that inherently handles mid-instruction branch targets. This handler, by virtue of its context, recognizes that the branch target's cell should not be patched and hence dispatches to traditional interpretation of the partial instruction stream.

If super-cells are used, a bit-map may be maintained for each paged-mapped set of cells. The bit map holds information identifying the set of cells that could not be safely branched to as a result of being part of a super-cell and not being the first cell representing the instruction. Preferably, each bit of the bit-map represents a Host cell of the Host page. When a branch instruction targets a given page-mapped set, the bit map may be inspected to see if the target may be safe. If the target is not safe, the branch reverts to the traditional interpreter loop.

In another embodiment, it would be possible to group a set of consecutive cells that map back to a single instruction to create super-execution cells. To correctly handle situations where the application branches into the middle of such an instruction a bit map of super-cells per logical page would be maintained and checked when branching to a given page. Should the application jump into the middle of the super-cell, the jump would have to be handled specially to correctly represent the expected behaviour of the hardware being emulated.

Calls and Jumps

Branch instructions may be handled in a different way. For a call type branch instruction instead of changing the branch-and-link common handler to branch-and-link CALL_handler it could be changed to branch-and-link to the target of the call. For a jump type branch instruction (no return) the patched code will simply branch to the target (or the branch-and-link portion could be no-op'd and the existing fall through branch could be modified):

For a jump type branch instruction (branch relative to the current program counter address), an example Guest execution cell after it has been executed for a jump type branch instruction (that branches ahead x bytes) is as follows:

```
...
label_cell_n:
nop
branch label_cell_n+x
label_cell_n+1:
...
```

Example Execution cell after it is executed for a call type branch instruction (that branches ahead x bytes):

```
...
lable_cell_n:
link_register = current_wu_address (constant)
branch label_cell_n+x
label_cell_n+1:
```

In an embodiment for emulating Guest branch instructions, a preferred common_handler provides a unique opportunity for managing the interaction of the page-mapped execution environment with either a more traditional interpreter or a Just-In-Time (JIT) compiler. A JIT compiler in an embodiment, dynamically "compiles" guest machine instructions into host machine instructions while executing the guest program. In one embodiment the input for such a JIT compiler may be a series of guest machine instructions that represent a particular path or 'trace' taken through the corresponding guest program. As a trace may be a particular runtime path, there would advantageously be some common point that will decide if and when to record a new trace and to subsequently initiate a JIT compile. The common_handler can serve as this decision point and therefore provide an interface for implementing this new trace discovery policy. In combination with code re-use/hotness mechanisms, this interface can be used for directing the execution back to either a traditional looped interpreter, continue with more page-mapped translation, or potentially invoke a JIT compiler to perform and execute more aggressive compilation of the trace.

In an example using execution cells as described, a call to an interrupt handler would not signal any sort of architected system interruption but would deal with the "interruption" in building and executing the execution cells. This interrupt handler's main purpose would be to revert back to an interpreter loop to execute the guest instructions and deal with any subsequent architected interruptions or exceptions from there.

Thread Safety and Concurrency of Execution

In a preferred implementation, multiple Host processors may be performing emulation activity executing instructions in a common Host page. Each Host processor may be executing a thread of a Guest processor. This presents a race condition if several processors are attempting to access the same initialized Host execution cell at the same time.

When multiple Host threads on different Host processors concurrently access the same initialized page mapped execution cell there may be a danger of inconsistent updates to the execution cell. For example, the first processor may be executing the execution cell initialization code and preparing to update the cell with semantic routine code while the second processor is also executing the initialization code. As a result, the second processor may be corrupting the first processor's execution sequence by overlaying new semantic code on the initialization code. As different Host processors are reading and writing the shared data that is in the execution cell, then extra care must be taken so only one of a few safe consistent states will be observed by any one Host thread. One approach to handling this could be for the logical page mapped execution units to be thread specific, thus avoiding concurrency all together.

Alternatively, to save space and reduce redundancy in cell patching phase, it may be preferable to have a common set of execution cells for all threads. In this case, the first thread through a given execution cell will drive invocation of the common_handler and be responsible for subsequent patching of the cell. If another thread tries to execute the same cell, this thread should either be held back on a lock while the first thread completes its patching operation, redirected back to a looped interpreter for execution until the first thread has completed its update to the execution cell, or allowed to fully repeat the first thread's update to the execution cell. In an embodiment, a bit significant table holds a lock bit for each cell. When a processor accesses a Host cell, it checks the bit table to see if the bit corresponding to the cell (or alternatively, a group of cells or an entire page of cells) is '0'. The processor modifies the bit to '1' and begins using the cell if it was '0'. If the cell was '1', the processor spins until the cell is '0' before setting the bit to '1' for its own use.

The choice for how concurrent execution may be managed may be very much dependent on characteristics of the implementation of this disclosure with respect to the hardware (and respective memory model) and the characteristics and constraints on the emulated environment.

In an example, the lead thread patches the call to common_handler with a branch back to the interpreter loop making it safe for the thread to patch the code below the branch-and-link. If on the other hand, the thread were to right away patch in the branch to the wu_handler then the code below the branch-and-link would not be guaranteed to have been updated yet and a subsequent thread might take the branch-and-link to the wu_handler but then encounter inconsistent or incorrect code when it returned.

It may be safe for two or more threads to race and both reach the common_handler and both start patching as the patched data by each thread should be the same.

Each thread that reaches the common_handler would preferably perform the following steps:
1) Change "branch-and-link common_handler" to "branch interpreter_loop_entry".
2) Update the necessary code below the branch-and-link such as the branch to the next cell and the ec_address. Also, if the cell may be going to inline the work-unit this inlined code would be patched in at this point.
3) Use platform dependent instruction cache invalidate or flush instructions and any necessary memory fence or sync instructions on the patched instructions so they are visible to all threads and processors.
4) Change "branch interpreter_loop_entry" to "branch-and-link <wu>_handler". If inlining the work unit then changes "branch interpreter_loop_entry" to the first inlined instruction or to a no-op instruction to replace the guarding branch instruction.

As long as the "branch-and-link common_handler" may be patched in such a way that it may be always observable as a valid branch instruction to either the common_handler or the interpreter_loop_entry then no thread can see any inconsistent updates to the code below the branch-and-link. On a number of platforms guaranteeing that the branch can be safely patched in this way may be mostly a matter of getting the alignment of the instruction correct. There are two cases, described below for the two threads Thread1 and Thread2, but applicable in general for any number of competing threads.
1) Thread1 gets to the cell first and starts patching but its change to the branch-and-link instruction may be not yet visible. In this case Thread2 will also take the branch-and-link (bl) to the common_handler and start patching—this may be safe as the to-be-patched code or data may be the same as what Thread1 may be already patching (i.e. the change may be id-empotent).
2) Thread1 gets to the cell first and starts patching and the change to bl may be visible. In this case Thread2 will take the newly patched in branch back to the interpreter loop and Thread1 can continue to safely patch.

An example emulation environment according to the present invention may be presented in order to provide a basis for understanding elements of the invention. The invention may be not limited to the example and one of average skill can appreciate that the invention could be advantageously practiced in a variety of environments.

Figure 3:
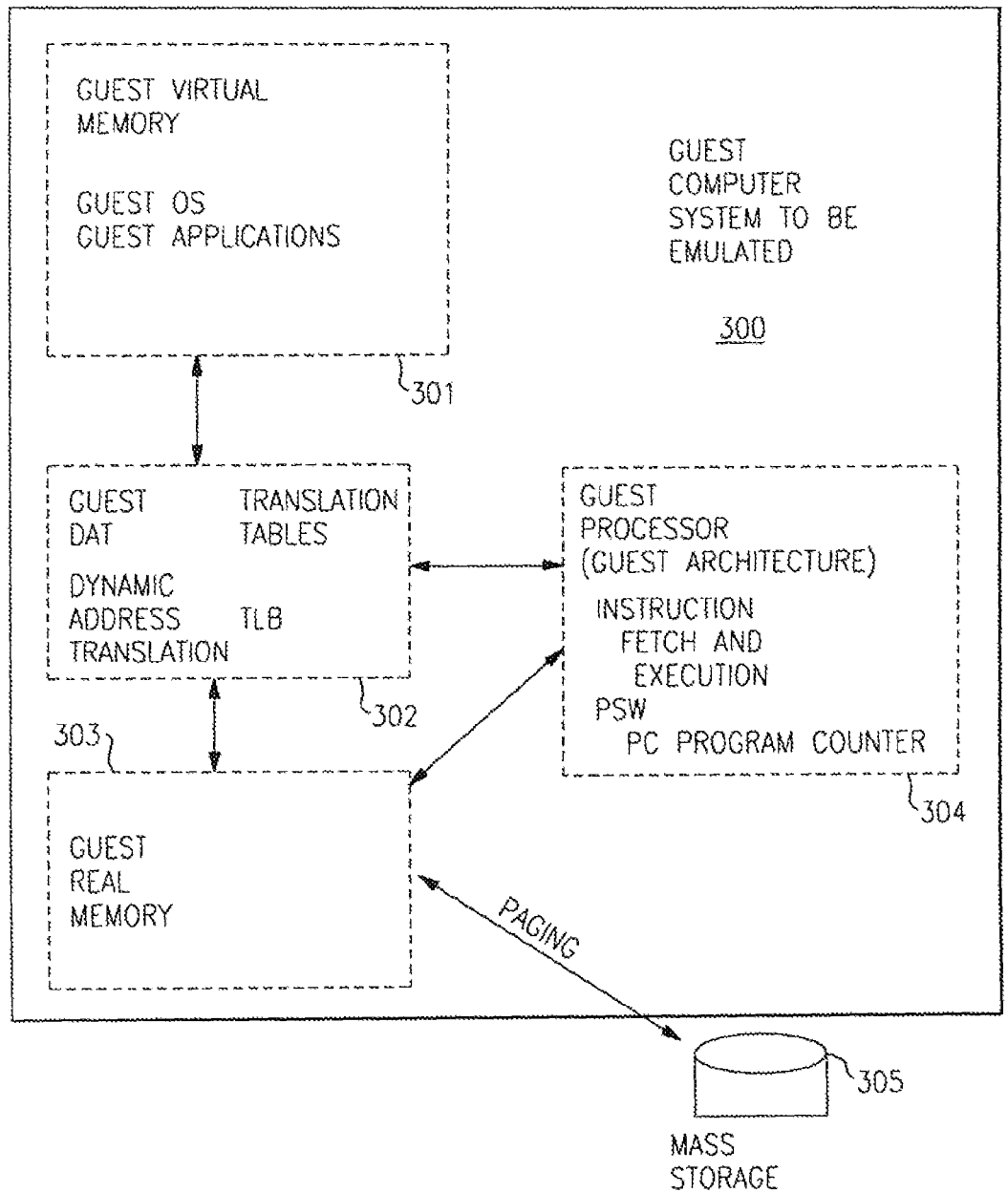
FIG. 3 is a diagram depicting an example Guest computer system to be emulated.

Referring to FIG. 3, a representative Guest Computer System 300 to be Emulated by a Host computer system is presented. The Guest Computer System 300 includes for example one or more Guest Processors 304 to be emulated. Functions of the Guest Processor 304 that may be emulated include an instruction fetch unit and one or more execution units, a Program Status Word (PSW) including a program counter for keeping track of the location of Guest Instructions in Guest Virtual memory 301. Other components of the Guest Achitecture of the Guest Processor 304 may be emulated including architected general purpose registers, architected floating point registers, architected control registers and the like. The Guest Computer System 300 includes a Guest Real Memory 303, Dynamic Address Translation (DAT) facility 302 (which includes mechanisms for translating the addresses of the program (virtual addresses) into real addresses of Guest Real Memory 303. The DAT may include Segment Tables and Page tables as are well known in the art. The page tables may have entries related to 4 Kbyte blocks of storage called "pages". The Guest Virtual Memory 301 may be typically much larger than Guest Real Memory 303 and therefore, only portions of Guest Virtual Memory 301 are held in Guest Real Memory 303 at any time. When a virtual page needs to be accessed, the Operating System (OS) may bring the page from Mass Storage 305 into Guest Real Memory 303. This operation may be commonly referred to as "paging" in. Paging may also occur when a page in Guest Real Memory 303 needs to be evicted in order to make room for a new page, this may be known as paging out.

The Guest Computer System 300 typically may be implemented in a Guest Architecture such as the z/Architecture from IBM® Corp. having an guest instruction set that may be a different instruction set than the host instruction set of the Host Architecture (such as X86 from INTEL® Corp.).

Figure 4:
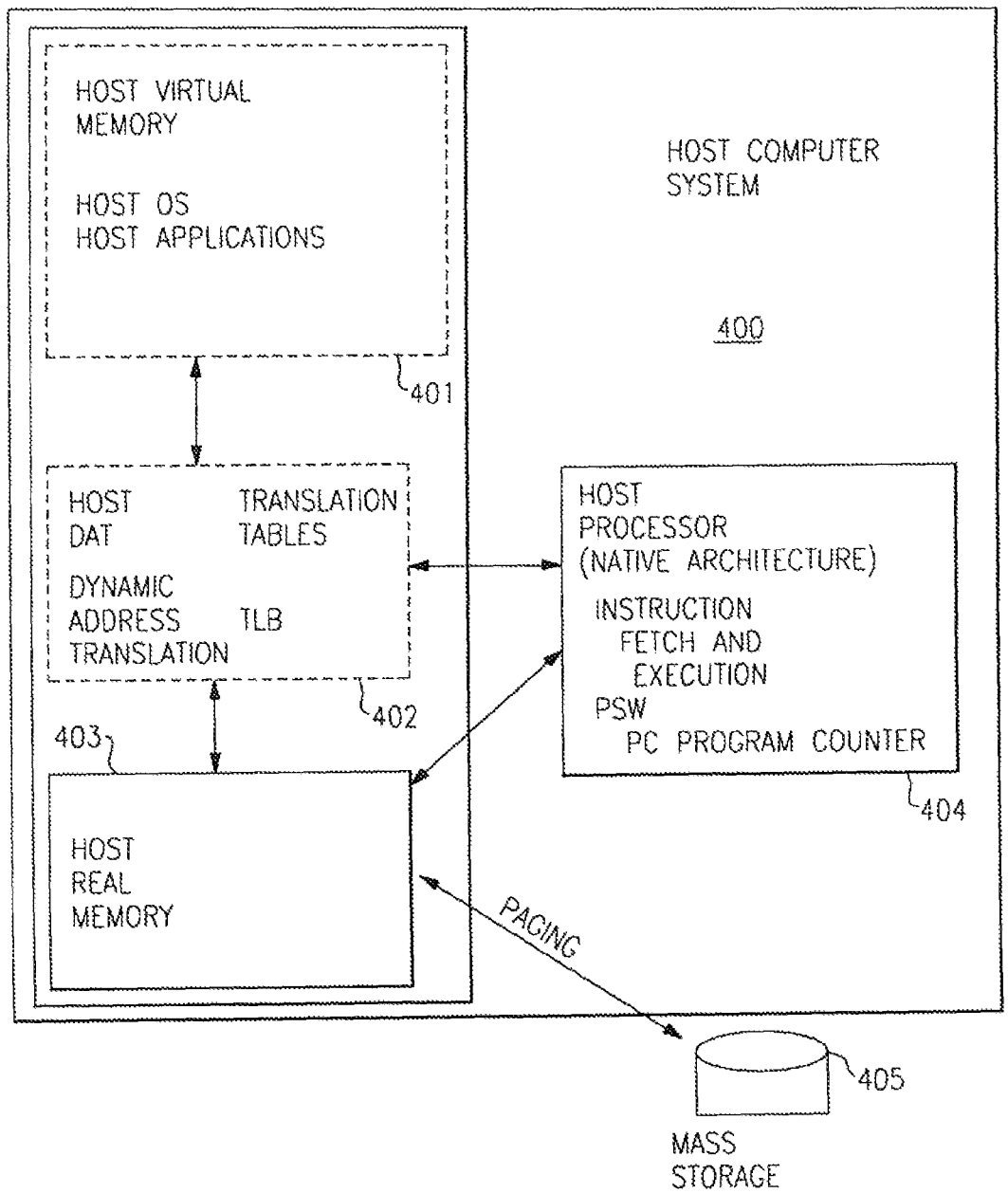
FIG. 4 is a diagram depicting an example Host computer system for emulating a Guest computer system.

Referring to FIG. 4, an example Host Computer System 400 is shown comprised of similar functions of the Guest Computer System 300 including one or more Host Processors 404 for executing instructions of the native processor architecture, a Mass Storage 405 for paging pages of virtual memory into Host Real Memory 403, Host DAT 402 and Host Virtual Memory 401 having Host Operating System (OS) and Host Applications. In an embodiment, emulation of the Guest Computer System 300 may be provided by one or more Host Applications.

Figure 5:
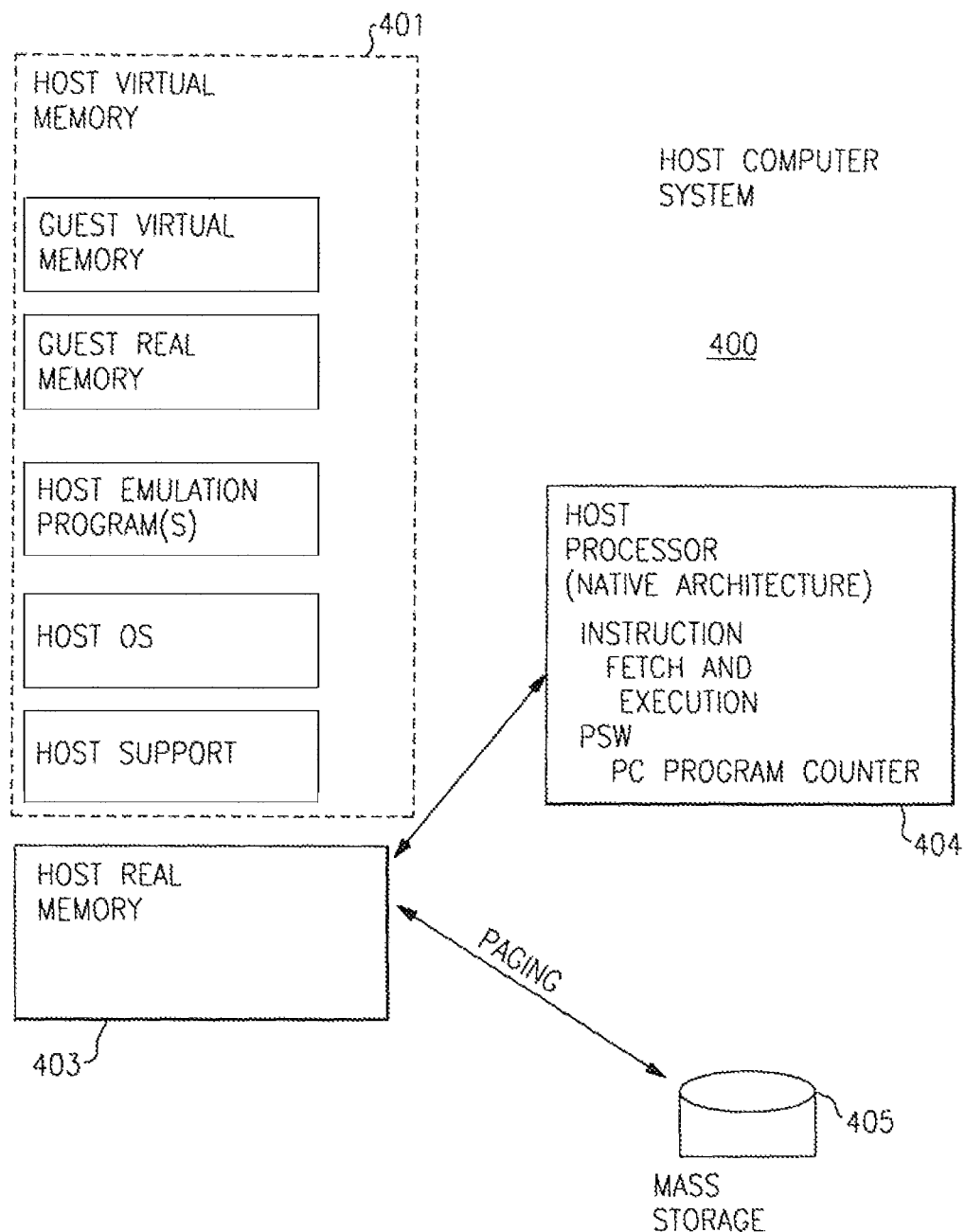
FIG. 5 depicts components of an example Host computer system memory system.

Referring to FIG. 5, an example of Host Virtual Memory 401 in an example Host Computer System 400 shows partitions having Guest Virtual Memory 301, Guest Real Memory 303, Host Emulation Programs, the Host OS and Host support programs. The Host Support programs may provide an I/O Subsystem, Logical Partitioning (Hypervisor), and operator console support for example. The Guest Real Memory 303 mapped to Host Virtual Memory 401 space, could be implemented in another embodiment in Host Real memory 403. The Host Emulation Program(s) are executed by the Host Processor 404 to emulate (simulate) operation of a Guest Processor 304. Thus, for example, the Host Emulation program will provide emulated registers and emulated Program Counter (PC) functions (logical program counter) of an emulated guest processor 304 for fetching and executing Guest Programs comprising guest instructions. In an implementation Host Emulation Programs translate Guest instructions into semantic routines emulating the function of the Guest instruction using Native instructions of the Host Processor 404.

Figure 6:
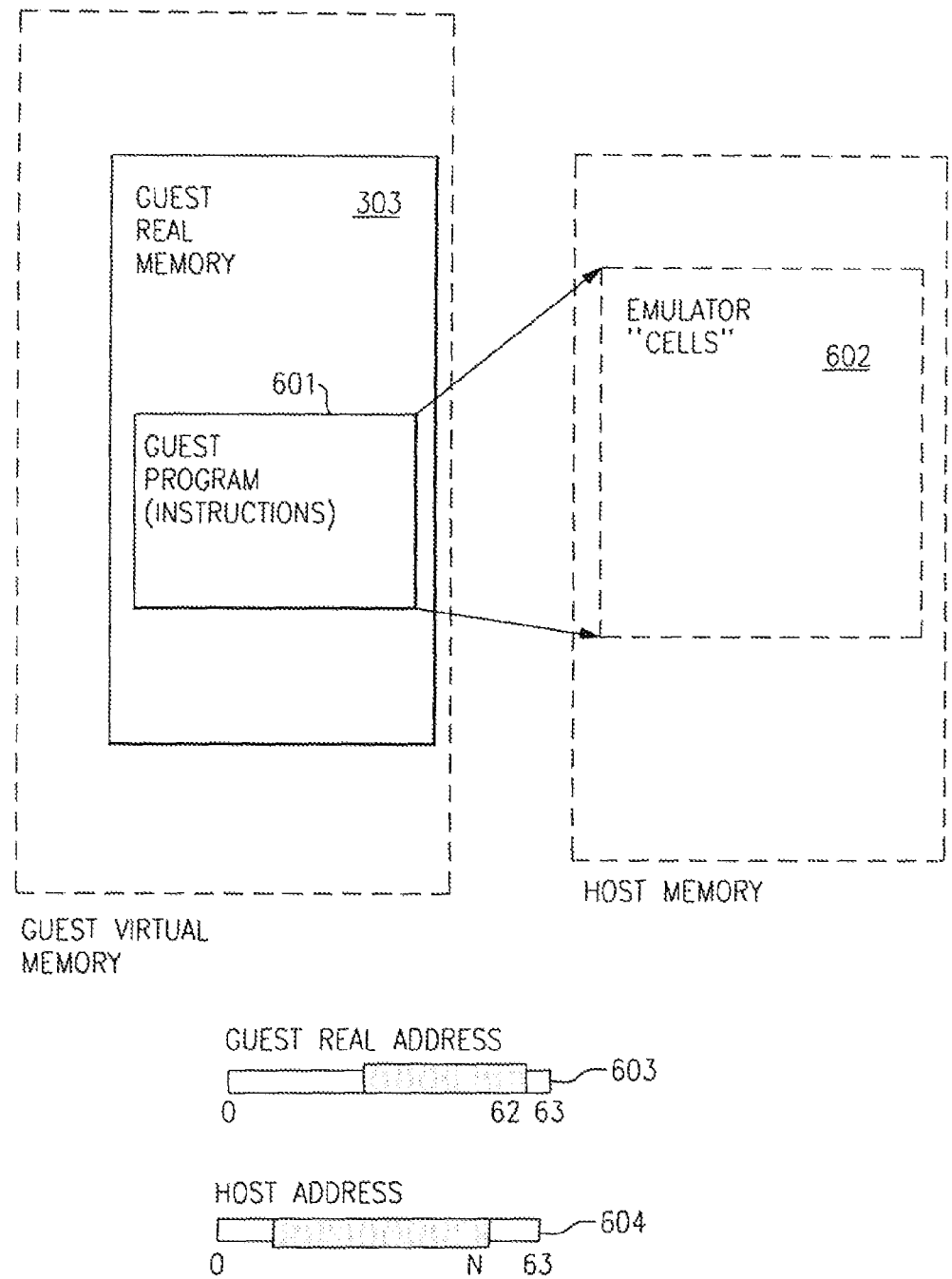
FIG. 6 depicts a mapping of Guest program instructions to Emulation cells of the invention.

Referring to FIG. 6, an embodiment of the present invention is shown wherein memory locations of Guest Programs 601 in Guest Real Memory 303 are mapped to corresponding addresses in Host Memory containing "Cells" 602. In a RISC Guest architecture having a fixed length instruction architecture (such as 32 bits or Word instruction length), each guest instruction location (Guest Cell) has a corresponding Host cell location. In a CISC Guest architecture, guest instructions can be different lengths (16 bits or Half Word, 32 bits or Word or 48 bits for example) so Emulator Cells in Host Memory 602 correspond to a minimum size instruction (one halfword for example) such that one cell corresponds to each Half Word for example. Thus the Guest Real Address 603 of a logical program counter increments according to the Guest instruction size (in the example 603, the guest real address may be a 64 bit address and bit 62 may be the lowest Guest PC address since it may be incremented with a Half Word granularity) and the corresponding Host Memory address 604, also 64 bits in this example, may be incremented with bit N being the lowest Host PC address corresponding to the size of a Host Cell in the Host Memory Cells 602.

Figure 7:
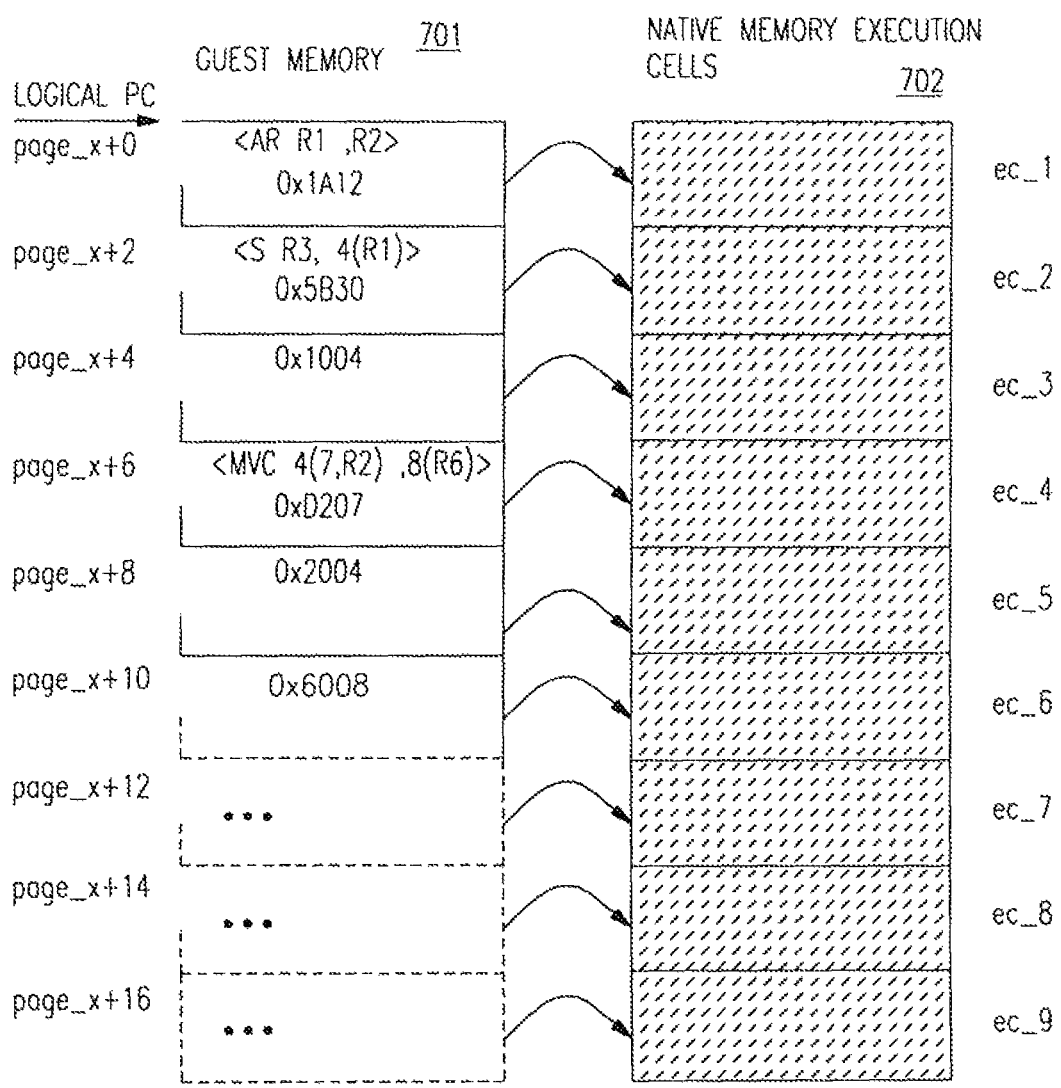
FIG. 7 depicts an example mapping of Guest instructions to Host (native) memory execution cells (ECs)

In the present invention, referring to FIG. 7, each page (4 Kbytes for example) of Guest Real Memory 701 may be initially mapped to a corresponding block (page) of Host Execution Cells (Host ECs). Initially, the corresponding EC's are un-initialized Host (Native) Memory 702. In an embodiment where the Guest instructions may be variable length, there may be one EC for each two bytes of guest memory page. Thus, in an example, the first HW of Guest page x corresponding to the logical Program Counter (PC) of the Guest contains a Guest (add register) AR instruction (with the hexadecimal encoding 0x1A12) for adding contents of Guest register R1 to R2 and storing the result in R1. The AR instruction at page_x+0 has a corresponding EC (ec_1). The next instruction may be a Full Word instruction (Subtract) S (0x5B30||0x1004), which has two corresponding EC's (ec_2, ec_3).

Referring to FIG. 8, after an execution cell (EC) is initially allocated (referring to FIG. 8), it may be initialized with a generic native instruction sequence 801 802 803. In an embodiment, all ECs corresponding to a Guest page are initialized when the Guest page is "paged into Guest memory". The generic native instruction sequence 801 802 803 may contain a branch to a common routine to patch the current EC (or a group of ECs). Thus, when the generic native instruction sequence is first executed, it branches to a common routine (common_handler) that over-writes the cell with a specific routine for emulating the Guest instruction.

Figure 9:
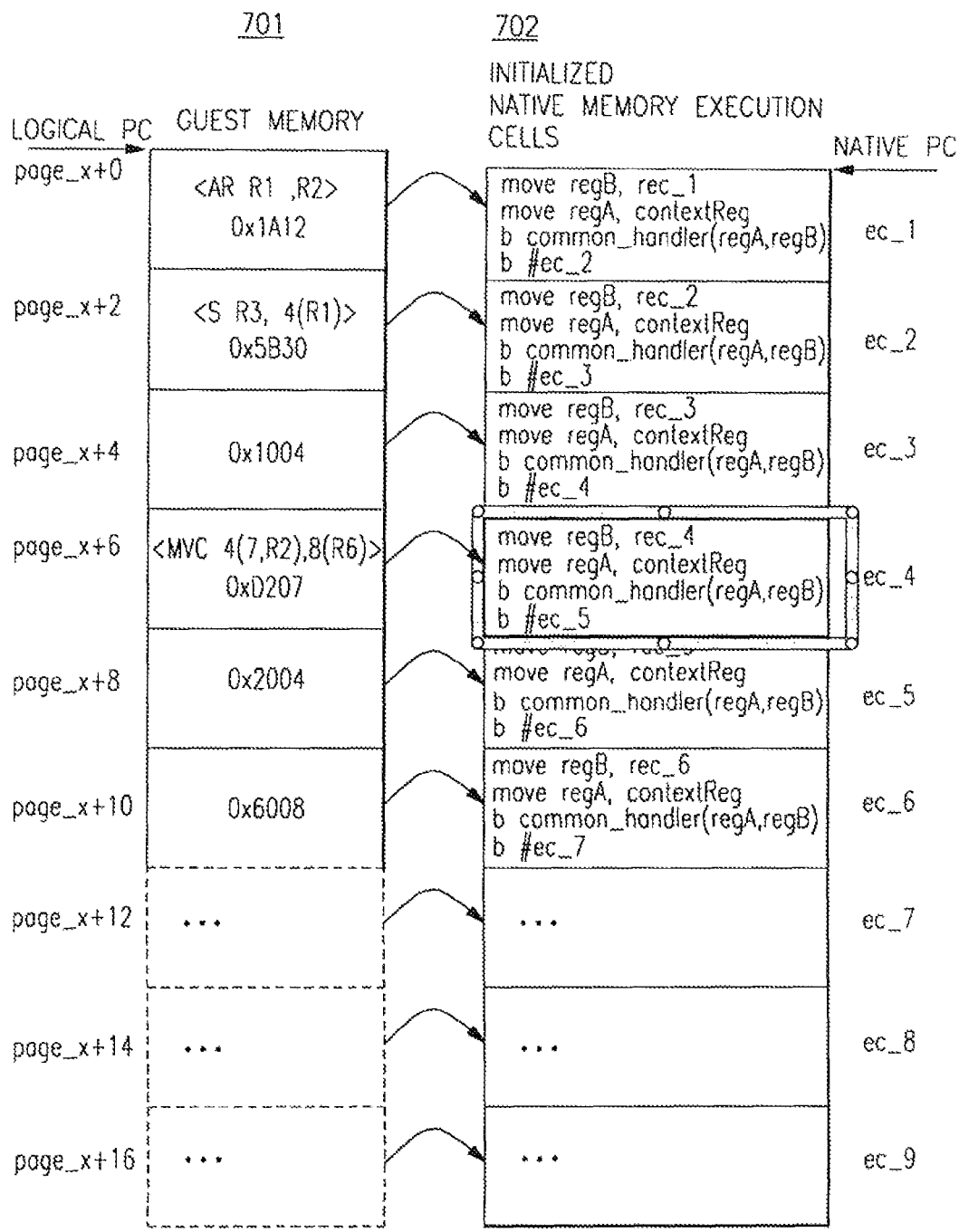
FIG. 9 depicts populated execution cells.

Referring to FIG. 9, the host processor uses a Native (Host) Program Counter (Native PC) to increment through the Native (Host) instructions. When the Guest program is to execute the Guest instruction beginning at a Guest logical PC address, the corresponding Native PC points to the Native memory Host cell to be executed. Preferably, the portion of the Host PC 604 that locates the Host cell of the Host page, is a shifted version of a portion of the Guest PC 603 that indexes into the Guest page.

The mapping of a guest memory work unit (wu) address (such as a Guest instruction address) to a native (Host) execution cell (EC) address is, for example:

ec_address=wu_to_ec_page_table(page(wu))+size-of-cell*((wu−page(wu))/min_wu_size);

In this example FIG. 9, we find the ec_address "ec_4" (highlighted) for Move Character (MVC) guest instruction at page_x+6 (0xD207) as follows:

wu=page_x+6=0x10002006, page (wu)=page_x=0x10002000 min_wu_size=2 bytes size_of_cell=4 byte/instruction*080003000 ec_address=ec_4=0x8000300+16*(0x10002006−0x10002000)/2=0x80003030

Execution of the common routine will preferably result in a call to the common_handler routine. This routine preferably performs the following steps in order to populate an EC with a specific routine for emulating the Guest instruction (wu).

1. Map the input ec_address to the corresponding guest work unit address (wu-address) and use this address to decode the instruction type into a wu_type.

2. Look-up the work unit handler routine based on the decoded wu_type.

3. Populate the generic execution cell instruction sequence so it handles the specific work unit type.

4. Branch to the input ec_address to execute the patched native instructions.

Figure 10:
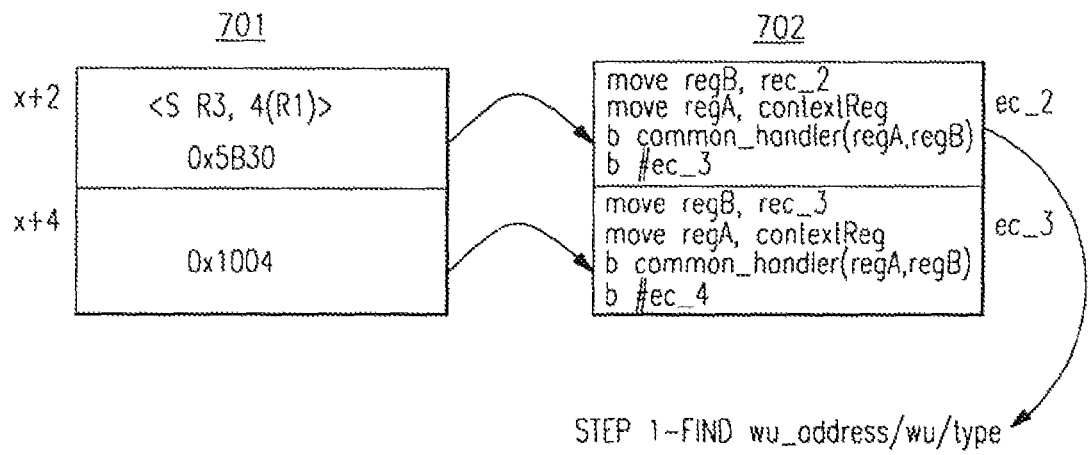

For this example, FIG. 10, program execution has reached the common_handler through the call in ec_2 for the logical address page_x+2 (containing the S guest instruction that may be 4 bytes in length occupying 2 ECs)

Step 1—Find wu_address/wu_type:

In an example in FIG. 10, mapping of a native execution cell address to a guest memory work unit address may be as follows:

wu_address=ec_to_wu_page_table(page(ec))+min_wu_size * ((ec−page(ec))/size_of_cell):

In this case, for example:
page_x+2=0x10002002
ec=ec_2=0x80003010, page(ec)=0x80003000
min_wu_size=2 bytes
size_of cell=4 byte/instruction*4 instructions=16 bytes
ec_to_wu_page_table(page(ec))=0x10002000
wu_address=0x10002000+2*(0x80003010−0x80003000)/16=0x10002002
wu_type=*(0x10002002)=0x5b=opcode for S (subtract)

Step 2—Look-up wu_handler:

Use the wu_type of 0x5b to index into a table of function pointers. In this case the returned wu_handler routine would be the <subtract_handler>. The wu_size will also be derived from the wu_type. In this case wu_size=4.

Figure 11:
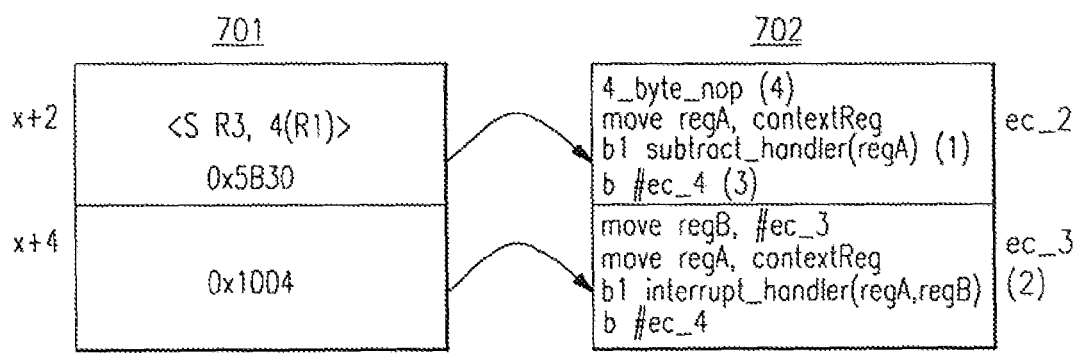

Step 3—Populate Execution Cell:

Preferably, the common_handler performs the four following patching actions for patching a corresponding Host EC in step 3 (referring to FIG. 11):

1) The execution cell "ec_2" branch to the common_handler may be changed to a call to the subtract_handler "ec_2".

2) As this wu_size>min_wu_size the ((wu_size−min_wu_size)/min_wu_size) execution cells after the current one must be patched with a call to an interrupt handler so that branches into the middle of a guest instruction are dealt with correctly (e.g. 4>2 so patch the (4−2)/2=1 execution cells)

3. The b #ec_3 in ec_2 may be updated to point to the execution handler for the next guest instruction.

4. The ec_address argument setup (move regB, #ec_2) may be replaced with a no-op (no operation) instruction as the ec_address may be not required by the wu_handler.

Step 4—Invoke Execution Cell:

Referring to FIG. 12, after the execution cell is fully patched, then the common_handler may invoke the newly patched instructions in "ec_2":

```
void common_handler (void *context, void *ec_address)
{
// STEP1, STEP2, STEP3
goto *(ec_address+4); // at (FIG. 12 ec_2) (skip over 4_byte nop)
}
```

Then after the subtract handler is called in ec_2 the previously patched in branch in "ec_2" to "ec_4" will be taken and the common_handler called for the MVC guest instruction:

```
void common_handler (void *context, void *ec_address
{
// STEP1, STEP2, STEP3, STEP4
}
```

Figure 13:
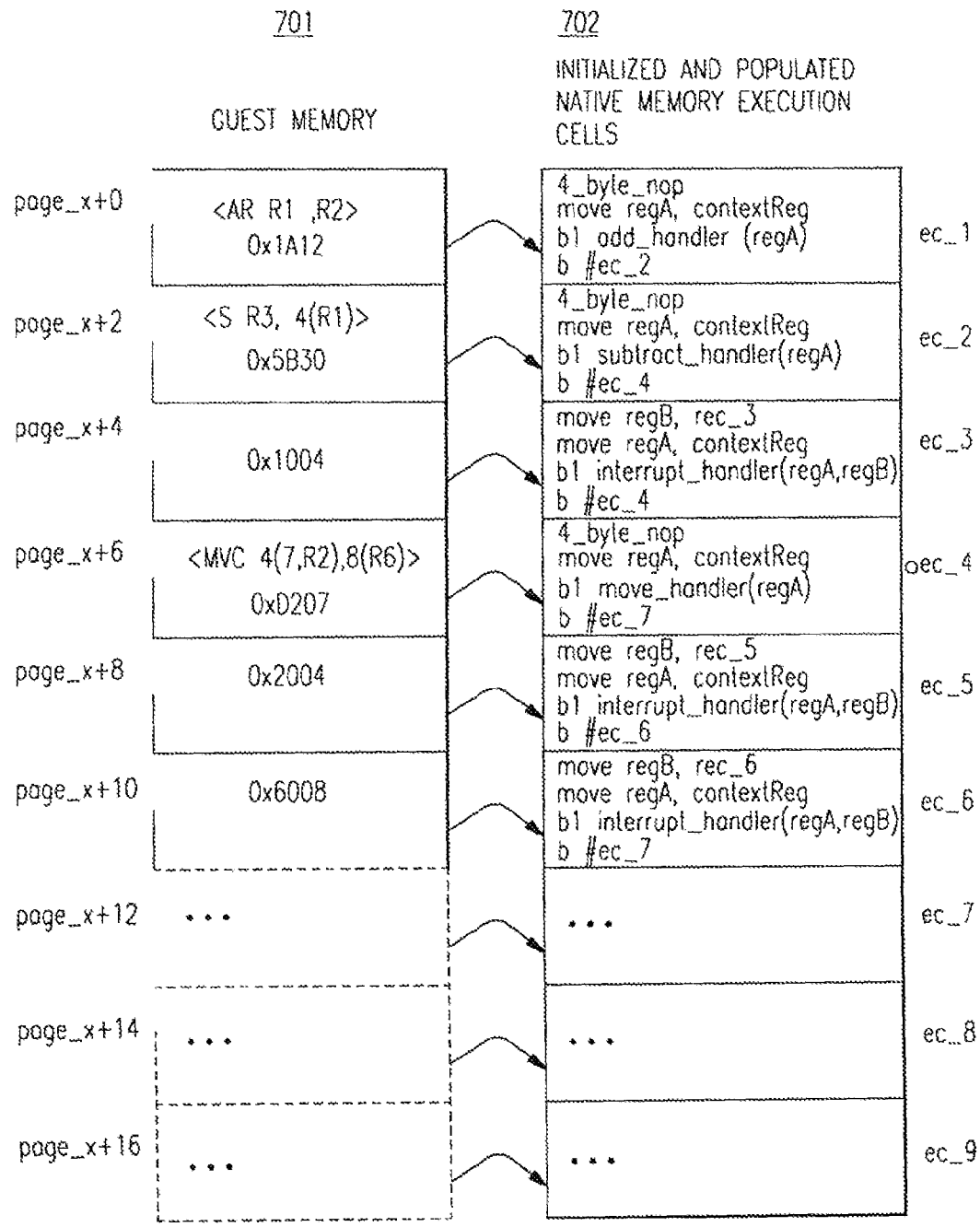

Referring to FIG. 13, the native memory execution cells 702 are shown after the example cells have been populated.

Other configurations of configured execution cells are possible within the scope of the invention. For example, execution cells may be padded with no-op instructions rather than branch instructions in order to perform better in machine pipelines when the next sequential guest instruction may be the next sequential Host execution cell.

Guest Branch Instructions:

Guest branch instructions may be handled differently than non-branching Guest instructions.

Figure 14:
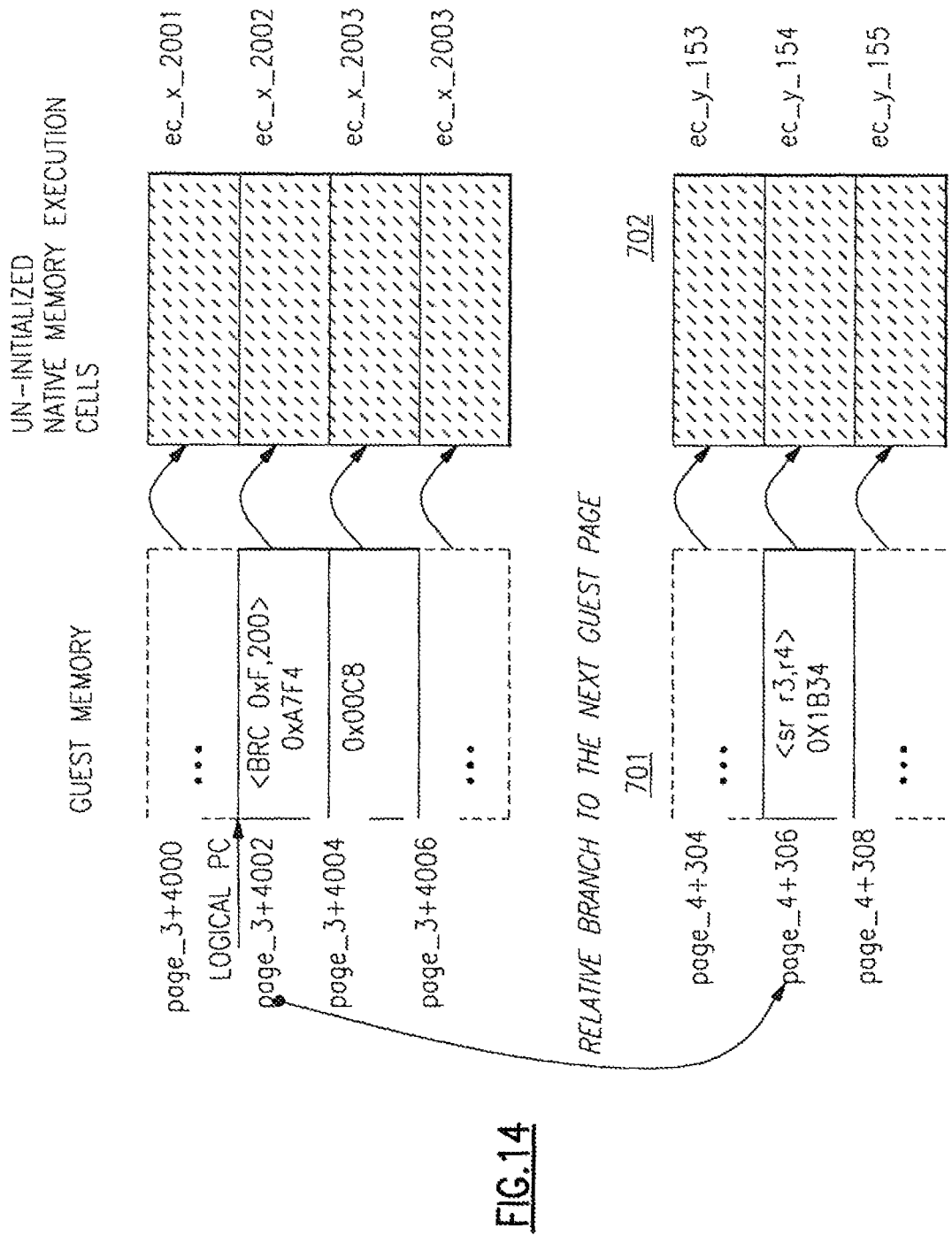

Referring to FIG. 14 in an embodiment, instead of encoding a call to a branch_handler in order to emulate the guest branch instruction, a native (Host) branch instruction branching directly to the destination Host execution cell (corresponding to the target guest instruction of the guest branch instruction) will be encoded in the execution cell.

Figure 15:
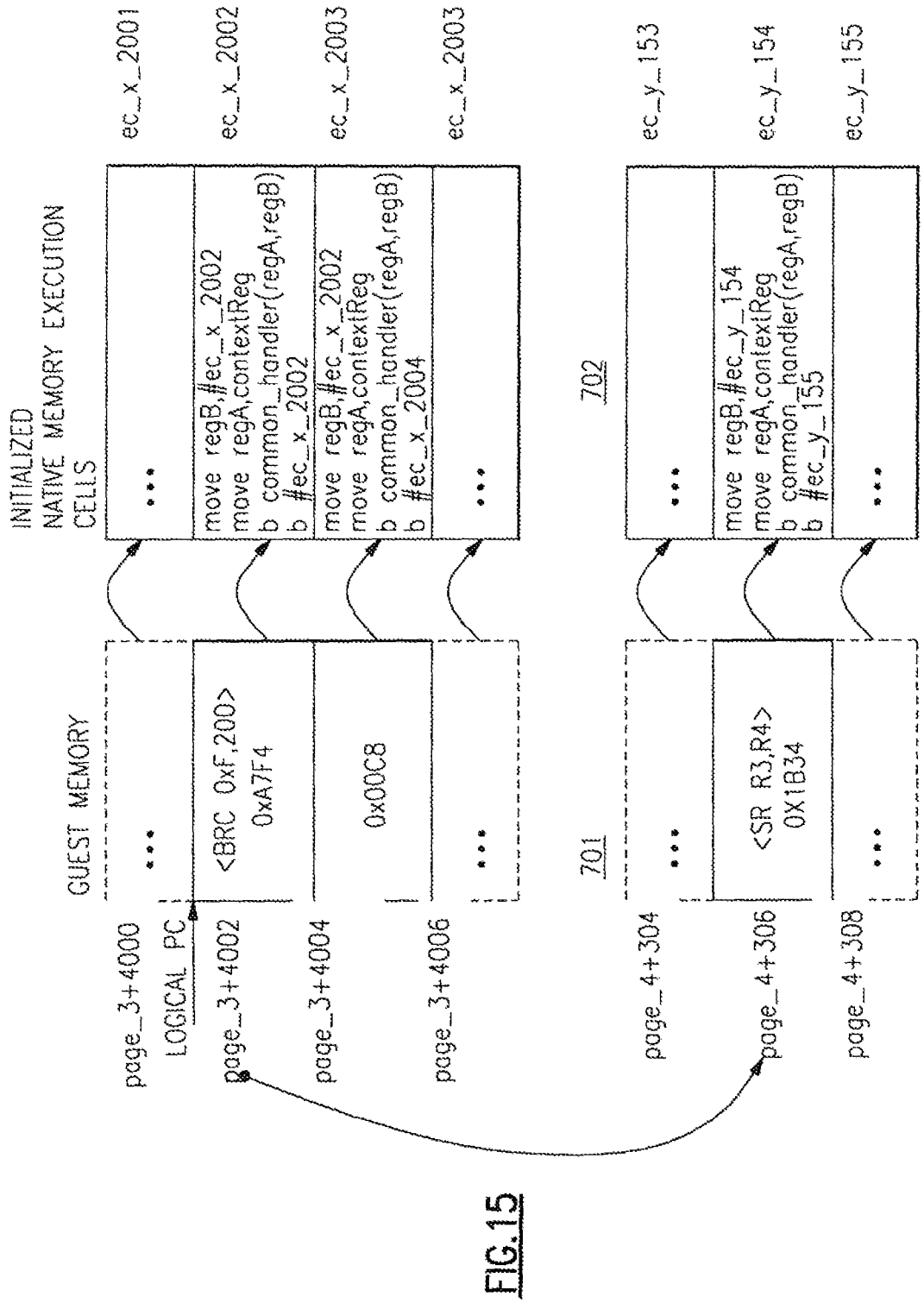

As in the earlier example, as each new guest page is encountered then the corresponding execution cells on the newly allocated native page are initialized with a generic native instruction sequence to branch to a common handler routine as shown in FIG. 15.

Figure 16:
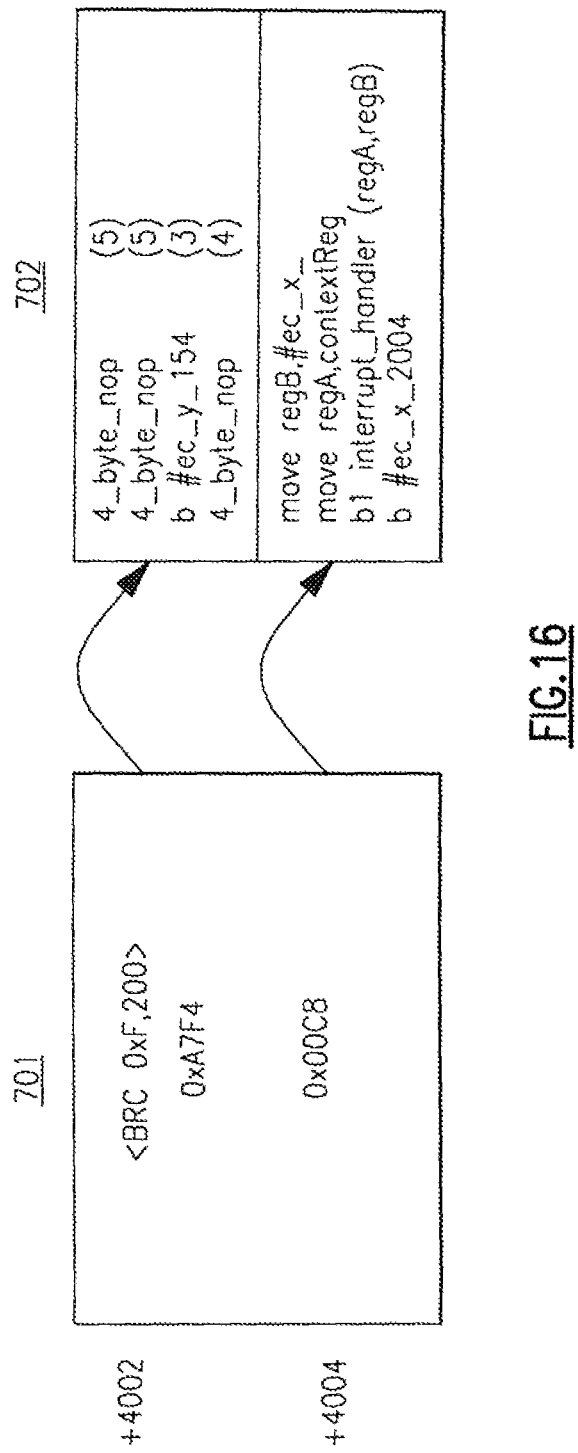

Referring to FIG. 16, in an embodiment, execution of an initialized, but unpopulated, cell will result in a call to the common_handler routine. In an embodiment, the common-handler routine performs the following steps in order to populate an execution cell for a guest branch instruction.

1. Map the input ec_address to the corresponding guest work unit address, wu_address, and use this address to decode the instruction type into wu_type (here wu_type may be some type of branch)

2. Obtain the target execution cell address from the current guest target address and the delta (offset into the page) from the current branch instruction text (here the delta may be +200 half words==+400 bytes). In an embodiment, a page size is 4096 bytes (4 Kb).

```
ec_address = wu_to_ec_page_table(page(wu)) +
             size_of_cell * ((wu − page(wu)) / min_wu_size);
```

In this example the ec_target_address of ec_y_154 for the SR guest instruction of the z/Architecture from IBM may be found:

```
target_wu = page_3+4002 + 400 = page_4+306 = 0x10004132
page(target_wu) = page_4 = 0x10004000
    min_wu_size = 2 bytes
    size_of_cell = 4 byte/instruction * 4 instructions = 16 bytes
    wu_to_ec_page_table(page(target_wu)) = 0x80009000
    ec_target_address = ec_y_154 = 0x80009000 + 16 *
       (0x10004132−0x10004000)/2 = 0x80009990
```

3. Replace the 'b common_handler' instruction with a 'b #ec_y_154' native instruction 4. Replace the 'b #ec_y_155' with a no-op instruction as this branch may be now unreachable.

5. Replace both argument setup instructions with no-op instructions as no handler may be being called now.

As this wu_size>min_wu_size the ((wu_size−min_wu_size)/min_wu_size), execution cells after the current one may be patched with a call to an interrupt handler so that branches into the middle of a guest instruction are dealt with correctly. (e.g. 4>2 so patch the (4−2)/2=1 execution cells).

Figure 17:
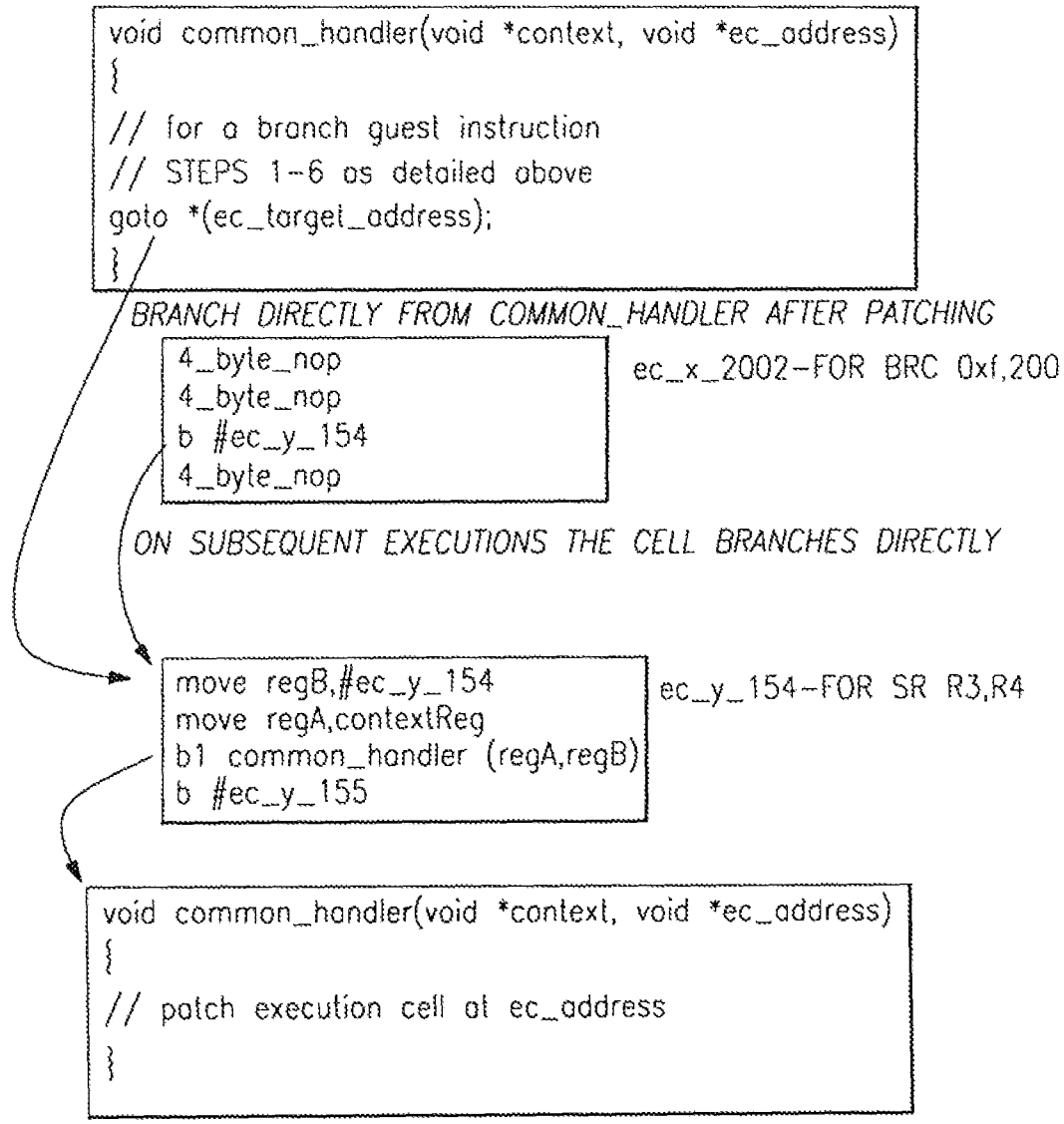

Execution Cell Patching:

Referring to FIG. 17, after the execution cell is fully patched then the common_handler may branch directly to the execution cell target address. Subsequent executions of the patched execution cell will reach the target cell by executing the patched in branch instruction.

There are several possible ways to patch the execution cell so that it will emulate the corresponding guest work unit.

Figure 18:
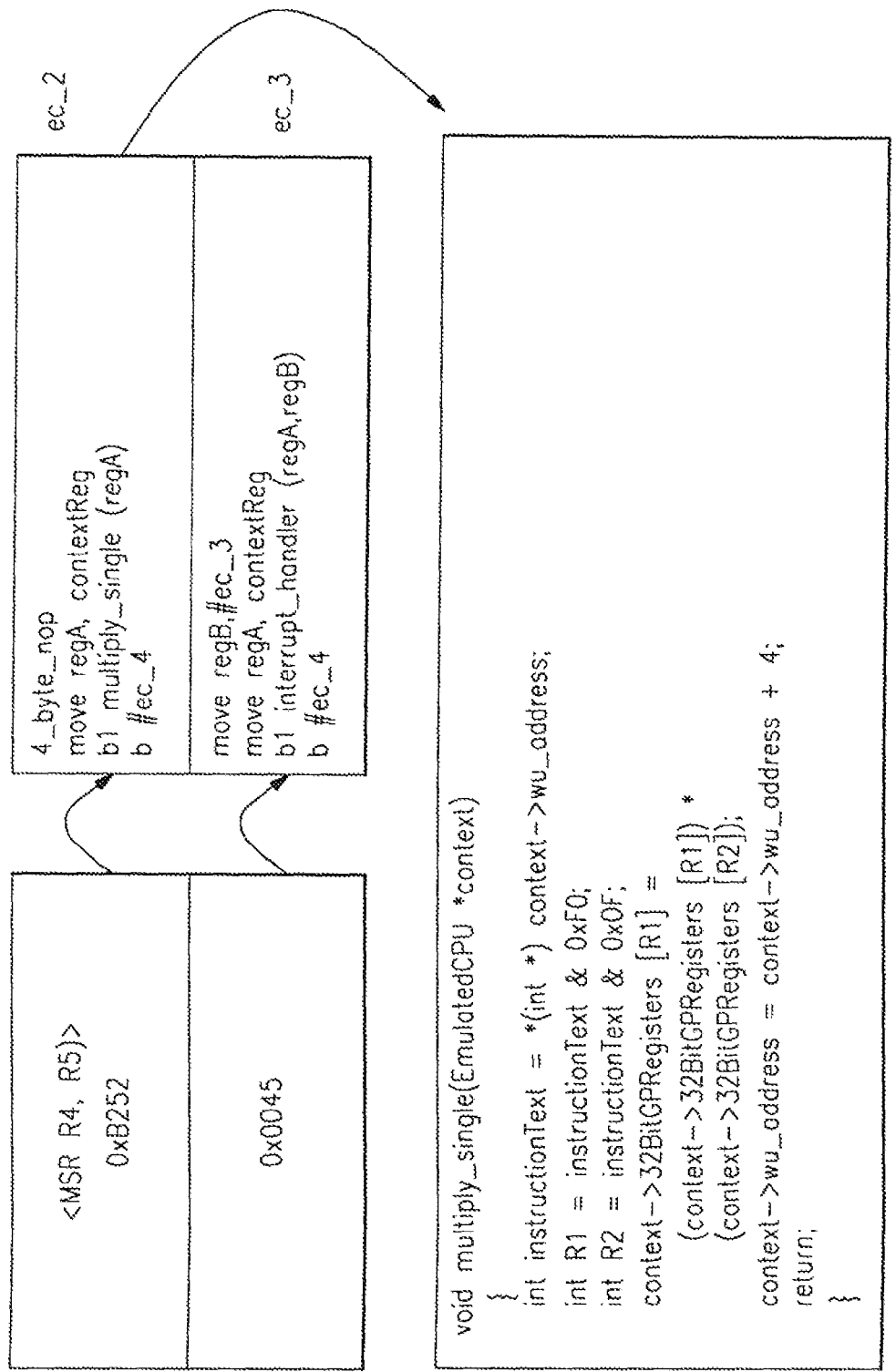

In one embodiment (FIG. 18) the execution cell may be patched with a call to a handler that may be specific to a particular type work unit.

In this embodiment the only parameter required by the handler routine may be a pointer to a data structure that contains all of the required context for the CPU being emulated. Among other data, this context includes the current guest work unit address and all parts of the emulated CPU facilities such as the registers.

This embodiment has the advantage that it may be simple to implement across a range of instruction types as each type may be dealt with in the same way when patching the execution cell. Another advantage may be that a minimal amount of space may be required in each execution cell for the native instruction sequence. A possible disadvantage may be that the instruction must be decoded on every subsequent execution of the cell in the handler routine.

Figure 19:
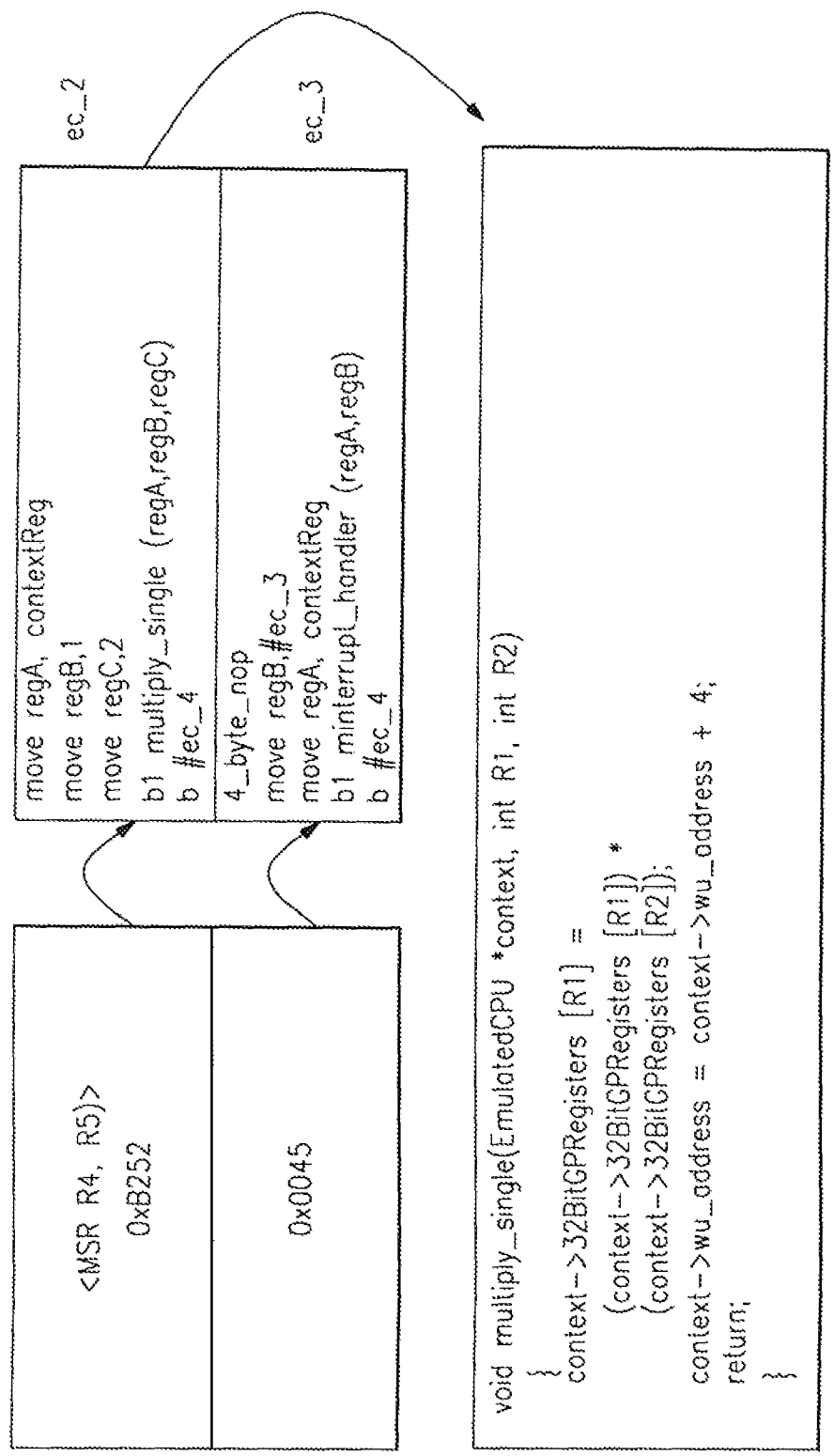

A second embodiment (FIG. 19) further specializes the execution cell by decoding, or 'cracking' the instruction text when populating the execution cell and then encoding native instructions to pass the decoded parts, such as the register numbers, to the handler routine. This removes the overhead of cracking the instruction text on subsequent executions of the patched cell. The cost may be that more space may be required in each execution cell to provide space for encoding the extra argument passing instructions.

In a third embodiment (FIG. 20), the execution cell may be specialized even more so that the call to the specific handler may be removed completely and the execution cell may be patched with the complete native instruction sequence required to emulate the corresponding work unit. To avoid excessive growth in the size of the execution cells this technique would only be applied to simpler work unit types that do not require too many native instructions to emulate. In this example, when populating the execution cell the guest instruction may be cracked and the offsets of the context pointer for the emulated registers and the wu_address are determined. With this information the exact native instruction sequence that will emulate the corresponding work unit can be encoded in the execution cell.

Figure 22:
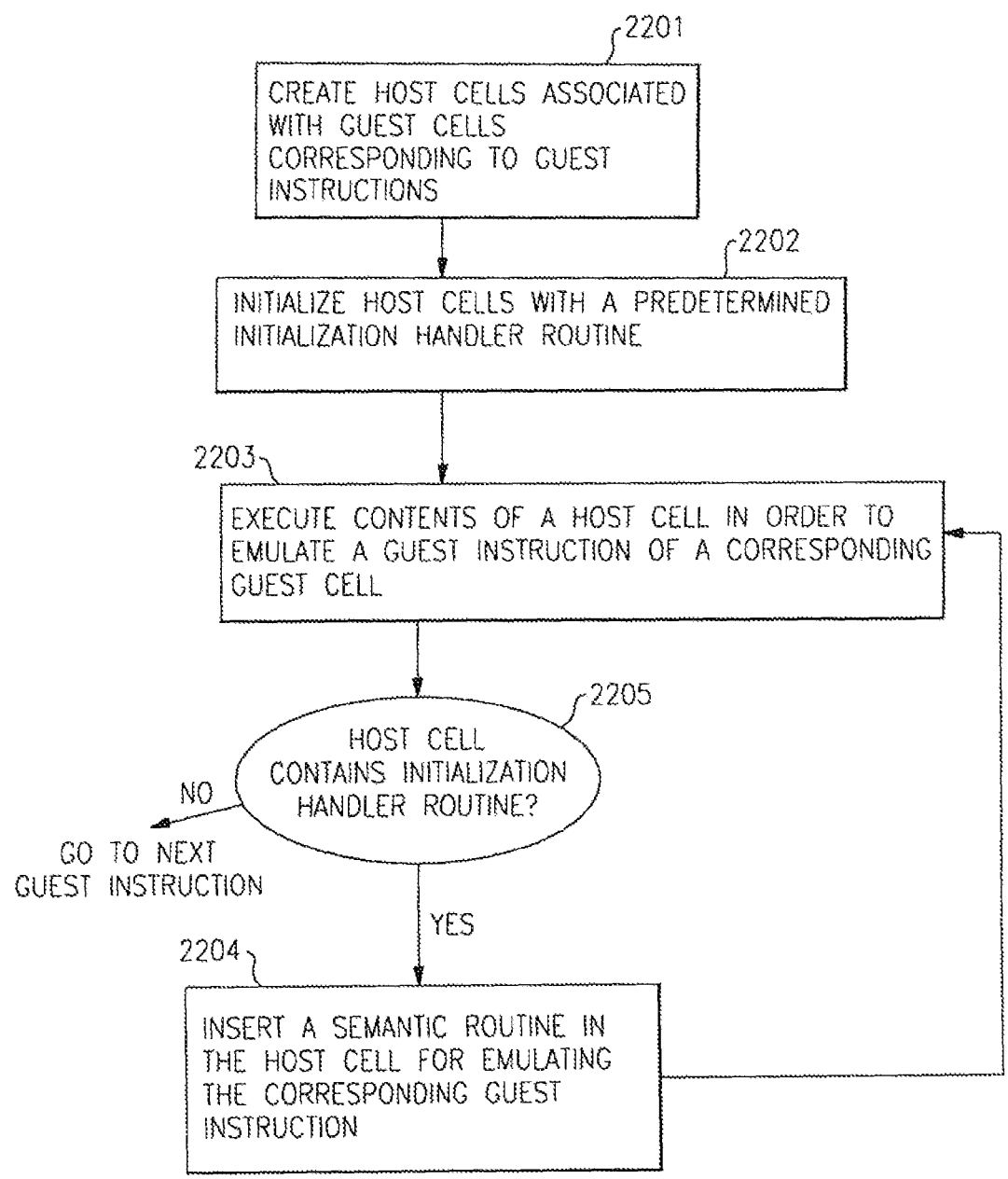
FIG. 22 depicts example method steps of the invention.

In an embodiment (FIG. 22), a cell association is created 2201 wherein each of n Guest cells of Guest addressable memory are associated with a corresponding Host cell of n Host cells of Host addressable memory, each of said n Guest cells corresponding to an opcode portion (beginning portion that is intended to be addressable by a program counter) of a Guest instruction to be emulated, wherein each Guest cell is Guest cell is x bytes of memory, wherein each Host cell is y bytes of memory. Each Host cell associated with a first Guest cell of each Guest instruction is initialized 2202 with an initialization routine. Responsive to the emulator determining that a Guest instruction is to be emulated, the emulator executes the contents of the corresponding Host cell to be executed 2203 comprising: if 2203 the corresponding Host cell has the initialization routine the execution of the Host cell causing the Host processor to patch 2204 the initialized Host cell with a semantic routine for executing the corresponding Guest instruction of the first Guest cell. If 2205 the corresponding Host cell has the semantic routine, the semantic routine is executed 2203 to perform the function of the Guest instruction. Once the semantic routine is executed, the emulator causes the next Guest instruction to be emulated.

In a preferred embodiment, all Guest accesses to storage (load and store instructions to memory) access Host pages rather than Guest pages.

In a preferred embodiment, the Guest page having Guest cells is a real or physical page having a real or physical address as seen by the Guest OS. In other embodiments, the Guest page is a virtual page having a virtual or logical address (the address used by the program before any underlying dynamic address translation). The virtual or logical page is accessed by a Guest program using dynamic address translation that maps the Guest program address to a real or physical memory location. The Guest real or physical memory location may be mapped by Host Dynamic Address Translation (DAT) to a Host real memory address. In another embodiment, the Host page having Host cells is a real or physical page having real or physical addresses as seen by the guest OS. In other embodiments the Host page is a virtual page having a virtual or logical address. The Host virtual or logical page is accessed by the Host emulation program using dynamic address translation that maps the Host program address to a real or physical memory location. A variety of Host emulation cell and Guest emulation cell mappings are possible, any of which would benefit from the teaching of the present invention.

The forgoing may be useful in understanding the terminology and structure of one computer system embodiment. The present invention may be not limited to the z/Architecture or to the description provided thereof. The present invention can be advantageously applied to other computer architectures of other computer manufacturers with the teaching herein.

While the preferred embodiment of the invention has been illustrated and described herein, it may be to be understood that the invention may be not limited to the precise construction herein disclosed, and the right may be reserved to all changes and modifications coming within the scope of the invention as defined in the appended claims.

What may be claimed is:

1. A computer program product for emulating execution of Guest processor instructions on a Host processor, the computer program product comprising a non-transitory tangible storage medium readable by a processing circuit and storing instructions for execution by the processing circuit for performing a method comprising:

creating a cell association wherein each of n Guest cells of Guest addressable memory are associated with a corresponding Host cell of n Host cells of Host addressable memory, each of said n Guest cells corresponding to a beginning portion of a Guest instruction to be emulated, wherein each Guest cell is Guest cell is x bytes of memory, wherein each Host cell is y bytes of memory;

initializing each Host cell associated with a first Guest cell of each Guest instruction with an initialization routine;

responsive to the emulator determining that a Guest instruction is to be emulated, the emulator causing the corresponding Host cell to be executed comprising:

responsive to the corresponding Host cell having the initialization routine, executing the initialization routine of the corresponding Host cell, the execution causing the Host processor to patch the initialized Host cell with a semantic routine for executing the corresponding Guest instruction of the first Guest cell; and responsive to the corresponding Host cell having the semantic routine, executing the semantic routine to perform the function of the Guest instruction.

2. The computer program product according to claim 1, wherein the initialization routine comprises a branch instruction to a common handler routine further comprising:

executing the common handler routine to determine the appropriate semantic routine with which to patch the initialized Host cell.

3. The computer program product according to claim 2, wherein the semantic routine comprises a branch instruction to an emulation routine further comprising:
- executing the branch instruction; and
- executing the emulation routine to perform function for the Guest instruction.

4. The computer program product according to claim 2, wherein the semantic routine of the Host cell comprises semantic routine elements in Host cells corresponding to a plurality of Guest cells of the Guest instruction.

5. The computer program product according to claim 2, wherein the semantic routine of the Host cell emulates a plurality of Guest instructions.

6. The computer program product according to claim 2, wherein the semantic routine comprises a branch instruction to a target Host cell comprising:
- executing the semantic routine to emulate execution of the corresponding Guest instruction;
- based on the branch instruction to the target Host cell, branching to the target Host cell; and
- executing a semantic routine of the target Host cell to emulate execution of a Guest instruction corresponding to the target Host cell.

7. The computer program product according to claim 2, further comprising:
- initializing each Host cell associated with each of a plurality of Guest cells of each Guest instruction with the initialization routine.

8. The computer program product according to claim 2, the determining that a Guest instruction is to be emulated further comprises:
- obtaining a lock before causing the initialization routine of the corresponding Host cell to be executed;
- preventing other threads or other processors from executing the initialization routine responsive to the obtained lock is held; and
- releasing the lock responsive to the initialization routine no longer needing the lock.

9. A computer system comprising:
- a memory; and
- a processor in communication with the memory, the computer system capable of performing a method comprising:
  - creating a cell association wherein each of n Guest cells of Guest addressable memory are associated with a corresponding Host cell of n Host cells of Host addressable memory, each of said n Guest cells corresponding to a beginning portion of a Guest instruction to be emulated, wherein each Guest cell is Guest cell is x bytes of memory, wherein each Host cell is y bytes of memory;
  - initializing each Host cell associated with a first Guest cell of each Guest instruction with an initialization routine;
  - responsive to the emulator determining that a Guest instruction is to be emulated, the emulator causing the corresponding Host cell to be executed comprising:
  - responsive to the corresponding Host cell having the initialization routine, executing the initialization routine of the corresponding Host cell, the execution causing the Host processor to patch the initialized Host cell with a semantic routine for executing the corresponding Guest instruction of the first Guest cell; and
  - responsive to the corresponding Host cell having the semantic routine, executing the semantic routine to perform the function of the Guest instruction.

10. The method according to claim 9, wherein the initialization routine comprises a branch instruction to a common handler routine further comprising:
- executing the common handler routine to determine the appropriate semantic routine with which to patch the initialized Host cell.

11. The computer system according to claim 10, wherein the semantic routine comprises a branch instruction to an emulation routine further comprising:
- executing the branch instruction; and
- executing the emulation routine to perform function for the Guest instruction.

12. The computer system according to claim 10, wherein the semantic routine of the Host cell comprises semantic routine elements in Host cells corresponding to a plurality of Guest cells of the Guest instruction.

13. The computer system according to claim 10, wherein the semantic routine of the Host cell emulates a plurality of Guest instructions.

14. The computer system according to claim 10, wherein the semantic routine comprises a branch instruction to a target Host cell comprising:
- executing the semantic routine to emulate execution of the corresponding Guest instruction;
- based on the branch instruction to the target Host cell, branching to the target Host cell; and
- executing a semantic routine of the target Host cell to emulate execution of a Guest instruction corresponding to the target Host cell.

15. The computer system according to claim 10, the determining that a Guest instruction is to be emulated further comprises:
- obtaining a lock before causing the initialization routine of the corresponding Host cell to be executed;
- preventing other threads or other processors from executing the initialization routine responsive to the obtained lock is held; and
- releasing the lock responsive to the initialization routine no longer needing the lock.

* * * * *